United States Patent
Woo et al.

(10) Patent No.: US 12,125,909 B2
(45) Date of Patent: Oct. 22, 2024

(54) ASYMMETRIC SEMICONDUCTOR DEVICE INCLUDING LDD REGION AND MANUFACTURING METHOD THEREOF

(71) Applicant: SAMSUNG ELECTRONICS CO., LTD., Suwon-si (KR)

(72) Inventors: Jongsung Woo, Hwaseong-si (KR); Changmin Jeon, Yongin-si (KR); Yongkyu Lee, Gwacheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 465 days.

(21) Appl. No.: 17/584,580

(22) Filed: Jan. 26, 2022

(65) Prior Publication Data

US 2022/0406935 A1 Dec. 22, 2022

(30) Foreign Application Priority Data

Jun. 21, 2021 (KR) .................. 10-2021-0079738

(51) Int. Cl.
*H01L 29/78* (2006.01)
*H01L 29/66* (2006.01)
(Continued)

(52) U.S. Cl.
CPC ...... *H01L 29/7835* (2013.01); *H01L 29/6656* (2013.01); *H01L 29/66575* (2013.01);
(Continued)

(58) Field of Classification Search
CPC ....... H01L 29/66575–66598; H01L 29/66515; H01L 29/66659; H01L 29/7835;
(Continued)

(56) References Cited

U.S. PATENT DOCUMENTS 5,585,658 A 12/1996 Mukai et al.
6,281,062 B1 * 8/2001 Sanchez .............. H01L 29/1083
257/E29.054

(Continued)

FOREIGN PATENT DOCUMENTS

KR 100525911 B1 11/2005
KR 100847827 B1 7/2008
KR 1020130045104 A 5/2013

OTHER PUBLICATIONS

Bansal et al. "Asymmetric Halo CMOSFET to Reduce Static Power Dissipation with Improved Performance". IEEE, School of Electrical and Computer Engineering Purdue University (Year: 2005).*

*Primary Examiner* — Maliheh Malek
(74) *Attorney, Agent, or Firm* — Sughrue Mion, PLLC

(57) ABSTRACT

A semiconductor device includes a substrate, a gate structure, source and drain regions, and first and second lightly doped drain (LDD) regions. The source and drain regions are spaced apart and formed in an active region of the substrate at opposite sides of the gate structure. The first LDD region surrounds one side surface and a bottom surface of the drain region and has a first junction depth. The second LDD region surrounds one side surface and a bottom surface of the source region and has a second junction depth less than the first junction depth. The gate structure includes a gate dielectric layer, a gate electrode, and gate spacers respectively disposed on opposite side walls of the gate dielectric layer and the gate electrode. One side wall of the gate dielectric layer and electrode is aligned with one side surface of the first LDD region.

20 Claims, 21 Drawing Sheets

(51) Int. Cl.
*H01L 29/786* (2006.01)
*H01L 21/8234* (2006.01)

(52) U.S. Cl.
CPC ...... *H01L 29/6659* (2013.01); *H01L 29/7833* (2013.01); *H01L 29/78624* (2013.01); *H01L 29/66492* (2013.01)

(58) Field of Classification Search
CPC ....... H01L 29/78624; H01L 21/823412; H01L 21/823807; H01L 29/66492; H01L 29/7833; H01L 29/7836; H01L 29/78621; H01L 29/7863; H01L 29/6659
See application file for complete search history.

(56) References Cited

U.S. PATENT DOCUMENTS

| | | | |
|---|---|---|---|
| 6,534,787 B2 | 3/2003 | Hsu | |
| 6,797,576 B1* | 9/2004 | Teng | H01L 29/66492 257/E29.054 |
| 7,936,042 B2* | 5/2011 | Kumar | H01L 21/26586 257/E29.039 |
| 7,994,580 B2 | 8/2011 | Tien et al. | |
| 8,163,619 B2* | 4/2012 | Yang | H01L 21/823807 257/408 |
| 8,304,835 B2* | 11/2012 | Bulucea | H01L 21/26513 257/368 |
| 8,735,980 B2* | 5/2014 | Bulucea | H01L 21/2658 257/408 |
| 10,608,043 B2* | 3/2020 | Chen | H01L 21/02532 |
| 10,916,652 B2 | 2/2021 | Lee | |
| 11,699,375 B1* | 7/2023 | Fujii | H01L 29/1083 345/204 |
| 11,869,968 B2* | 1/2024 | Takeuchi | H01L 29/7835 |
| 2001/0013628 A1* | 8/2001 | Tyagi | H01L 29/7835 257/E29.268 |
| 2001/0019869 A1 | 9/2001 | Hsu | |
| 2005/0227448 A1* | 10/2005 | Chen | H01L 21/823418 257/E21.619 |
| 2007/0085145 A1 | 4/2007 | Tien et al. | |
| 2008/0157198 A1 | 7/2008 | Kim et al. | |
| 2009/0057784 A1* | 3/2009 | Chen | H01L 29/66659 257/408 |
| 2009/0121258 A1* | 5/2009 | Kumar | H01L 29/7833 438/151 |
| 2010/0032749 A1* | 2/2010 | Shrivastava | H01L 29/0847 257/E29.256 |
| 2010/0155858 A1* | 6/2010 | Chen | H01L 29/66659 257/E29.268 |
| 2010/0213542 A1* | 8/2010 | Chu | H01L 29/0847 257/E29.256 |
| 2011/0070710 A1* | 3/2011 | Lee | H01L 29/7835 438/302 |
| 2012/0061761 A1 | 3/2012 | Makiyama et al. | |
| 2012/0098072 A1* | 4/2012 | Han | H01L 21/26586 257/E29.268 |
| 2013/0102114 A1 | 4/2013 | Lee et al. | |
| 2013/0126970 A1* | 5/2013 | Bulucea | H01L 29/66659 257/335 |
| 2015/0008482 A1* | 1/2015 | Sato | H01L 27/14689 257/183.1 |
| 2018/0212041 A1* | 7/2018 | Dolny | H01L 29/66659 |
| 2018/0286981 A1* | 10/2018 | Jang | H01L 29/66681 |
| 2020/0194588 A1 | 6/2020 | Lee | |
| 2020/0343380 A1* | 10/2020 | Takeuchi | H01L 29/7835 |
| 2022/0238710 A1* | 7/2022 | Takeuchi | H01L 29/086 |

* cited by examiner

ASYMMETRIC SEMICONDUCTOR DEVICE INCLUDING LDD REGION AND MANUFACTURING METHOD THEREOF

CROSS-REFERENCE TO THE RELATED APPLICATION

This application claims priority from Korean Patent Application No. 10-2021-0079738, filed on Jun. 21, 2021, in the Korean Intellectual Property Office, the disclosure of which is incorporated by reference herein in its entirety.

BACKGROUND

1. Field

The exemplary embodiments of the disclosure relate to an asymmetric semiconductor device including a lightly doped drain (LDD) region and a manufacturing method thereof.

2. Description of the Related Art

An asymmetric high-voltage semiconductor device uses a double doped drain (DDD) structure including a highly doped region and a lightly doped region formed upon formation of a source/drain region, in order to achieve an increase in breakdown voltage. The DDD structure includes a junction having a low doping concentration in order to withstand a high breakdown voltage and, as such, the breakdown voltage of a junction of a source region or a drain region is increased. For an increase in breakdown voltage in an asymmetric high-voltage transistor having such a DDD structure, it is necessary to increase a junction area of the source region and/or the drain region. In this case, however, there is a drawback in that the overall size of the resultant semiconductor device is increased.

SUMMARY

It is an aspect to provide an asymmetric high-voltage semiconductor device having enhanced reliability while having a reduced size.

It is another aspect to provide a method for manufacturing an asymmetric high-voltage semiconductor device having enhanced reliability while having a reduced size.

According to an aspect of one or more exemplary embodiments, there is provided a semiconductor device comprising a substrate comprising an active region; a gate structure disposed on the active region; a source region and a drain region formed in the active region at opposite sides of the gate structure, respectively, the source region being spaced apart from the drain region; a first lightly doped drain (LDD) region surrounding one side surface and a bottom surface of the drain region, the first LDD region comprising first-conductivity-type impurities and having a first junction depth; and a second LDD region surrounding one side surface and a bottom surface of the source region, the second LDD region comprising the first-conductivity-type impurities and having a second junction depth less than the first junction depth. The gate structure comprises a gate dielectric layer, a gate electrode on the gate dielectric layer, and gate spacers respectively disposed on opposite side walls of the gate dielectric layer and the gate electrode. One side wall of the opposite side walls of the gate dielectric layer and the gate electrode is aligned with one side surface of the first LDD region.

According to another aspect of one or more exemplary embodiments, there is provided a semiconductor device comprising a substrate comprising an active region; a gate structure disposed on the active region; a source region and a drain region formed in the active region at opposite sides of the gate structure, respectively, the source region being spaced apart from the drain region; a first lightly doped drain (LDD) region formed in the active region adjacent to the drain region, the first LDD region comprising first-conductivity-type impurities and having a first junction depth; a first halo region formed in the active region adjacent to the first LDD region, the first halo region comprising second-conductivity-type impurities; a second LDD region formed in the active region adjacent to the source region, the second LDD region comprising the first-conductivity-type impurities and having a second junction depth less than the first junction depth; and a second halo region formed in the active region adjacent to the second LDD region, the second halo region comprising the second-conductivity-type impurities. The gate structure comprises a gate stack, and gate spacers respectively disposed on opposite side walls of the gate stack. One side surface of the second LDD region is offset from the opposite side walls of the gate stack. One side surface of the first LDD region is aligned with one side wall of the opposite side walls of the gate stack.

According to yet another aspect of one or more exemplary embodiments, there is provided a semiconductor device comprising a substrate comprising an active region; a gate structure disposed on the active region; a source region and a drain region formed in the active region at opposite sides of the gate structure, respectively, the source region being spaced apart from the drain region; a first lightly doped drain (LDD) region formed in the active region adjacent to the drain region, the first LDD region comprising first-conductivity-type impurities and having a first junction depth; a first halo region formed in the active region adjacent to the first LDD region, the first halo region comprising second-conductivity-type impurities; a second LDD region formed in the active region adjacent to the source region, the second LDD region comprising the first-conductivity-type impurities and having a second junction depth less than the first junction depth; and a second halo region formed in the active region adjacent to the second LDD region, the second halo region comprising the second-conductivity-type impurities. The gate structure comprises a gate stack, and gate spacers respectively disposed on opposite side walls of the gate stack. One side surface of the second LDD region is offset from the opposite side walls of the gate stack. One side surface of the first LDD region is aligned with one side wall of the opposite side walls of the gate stack. At least a portion of the first halo region vertically overlaps with the gate stack and at least a portion of the second halo region vertically overlaps with the gate stack.

DETAILED DESCRIPTION OF EXEMPLARY EMBODIMENTS

Figure 1:
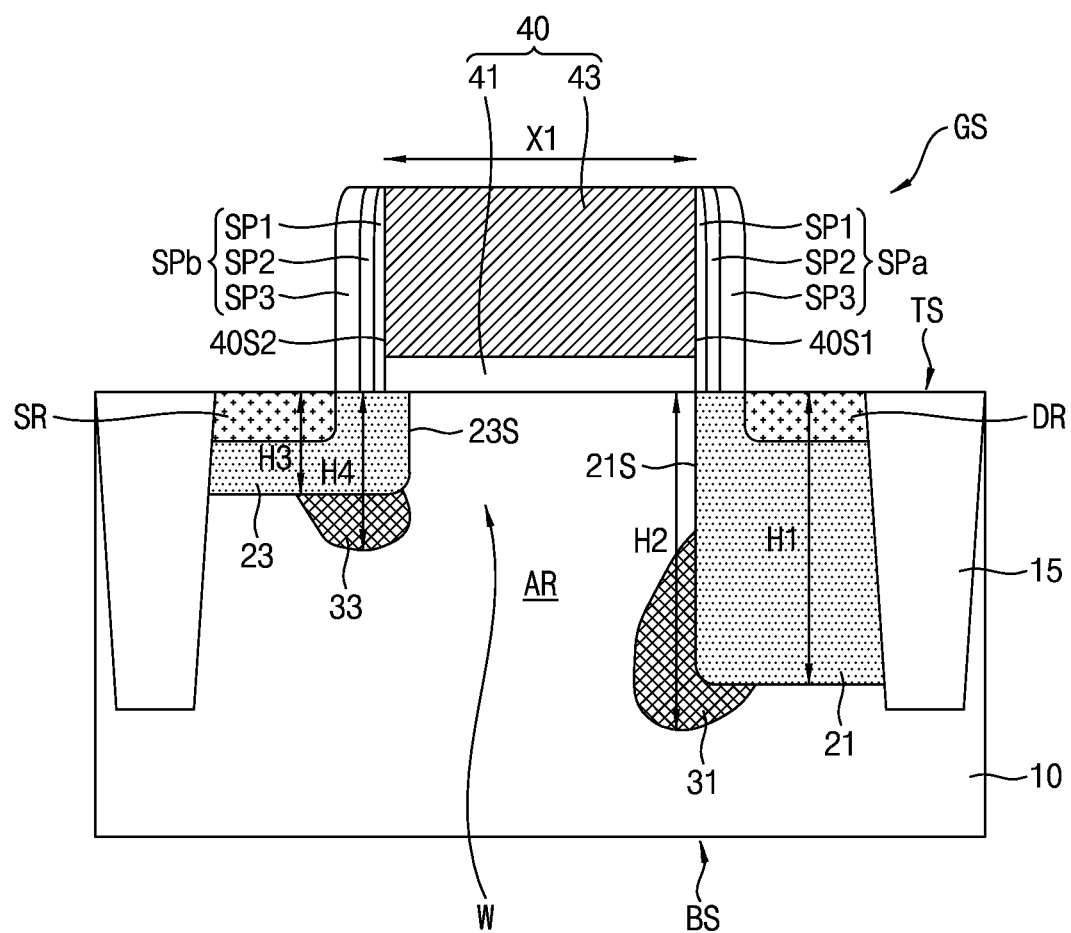
FIG. 1 is a sectional view of a semiconductor device according to an exemplary embodiment.

FIG. 1 is a sectional view of a semiconductor device according to an exemplary embodiment.

Referring to FIG. 1, the semiconductor device may include a semiconductor substrate 10, an active region AR in the semiconductor substrate 10, an element isolation layer 15 defining the active region AR, and a gate structure GS disposed on the active region AR.

The semiconductor substrate 10 may be any kind of substrate capable of forming a field effect transistor. For example, the semiconductor substrate 10 may be a silicon substrate, a silicon-germanium substrate, a glass substrate, or the like. The active region AR may be defined by the element isolation layer 15. The element isolation layer 15 may be a shallow trench isolation layer. The element isolation layer 15 may include silicon oxide.

The active region AR may include a well region W, a source region SR, a drain region DR, a first lightly doped drain (LDD) region 21 and a second LDD region 23, and a first halo region 31 and a second halo region 33. The well region W may be disposed in the active region AR under the gate structure GS. The well region W may include first-conductivity-type impurities. For example, the first conductivity type may be p type or n type. P-type impurities may include any kind of impurities capable of generating a hole as a main carrier. For example, the p-type impurities may include boron (B), aluminum (Al), gallium (Ga), indium (In), and/or thallium (Tl). In some exemplary embodiments, the p-type impurities may include one or more selected from the group consisting of boron (B), aluminum (Al), gallium (Ga), indium (In) and thallium (Tl) which are group III elements on the Periodic Table. N-type impurities may include any kind of impurities capable of generating an electron as a main carrier. For example, the n-type impurities may include nitrogen (N), phosphorous (P), arsenic (As), antimony (Sb) and/or bismuth (Bi). In some exemplary embodiments, the n-type impurities may include one or more selected from the group consisting of nitrogen (N), phosphorous (P), arsenic (As), antimony (Sb) and bismuth (Bi) which are group V elements on the Periodic Table.

The source region SR and the drain region DR may be disposed in the active region AR adjacent to opposite sides of the gate structure GS, respectively. The source region SR may be disposed at one side of the gate structure GS, and the drain region DR may be disposed at the other side of the gate structure GS. In some exemplary embodiments, a sidewall of the source region SR may be coplanar with a side wall of the gate structure GS. In other words, in some exemplary embodiments, the source region SR may be disposed in the active region AR between the gate structure GS and the element isolation layer 15. In some exemplary embodiments, a sidewall of the drain region DR may be coplanar with a side wall of the gate structure GS. In other words, in some exemplary embodiments, the drain region SR may be disposed in the active region AR between the gate structure GS and the element isolation layer 15. The source region SR and the drain region DR may be spaced apart from each other under the condition that the well region W is interposed therebetween. The source region SR and the drain region DR may include second-conductivity-type impurities different from impurities included in the well region W. The second conductivity type may be p type or n type. For example, when the well region W includes n-type impurities, the source region SR and the drain region DR may include p-type impurities, whereas, when the well region W includes p-type impurities, the source region SR and the drain region DR may include n-type impurities.

A low voltage, which is relatively lower than a voltage applied to the drain region DR, may be applied to the source region SR. A high voltage, which is relatively higher than a voltage applied to the source region SR, may be applied to the drain region DR. In some exemplary embodiments, the semiconductor device may be an asymmetric high-voltage semiconductor device in which a high voltage is applied to a drain region DR and which has an asymmetric structure. In the semiconductor device, the LDD regions 21 and 23 and the halo regions 31 and 33, which will be described later, may have an asymmetric structure.

The first and second LDD regions 21 and 23 may be disposed in the active region AR adjacent to the opposite sides of the gate structure GS, respectively. In some exemplary embodiments, a portion of the first LDD region 21 may be disposed in the active region AR vertically underneath a portion of the gate structure GS and another portion of the first LDD region 21 may be disposed in the active region AR so as not to be vertically underneath the gate structure GS in a vertical direction. In some exemplary embodiments, a portion of the second LDD region 23 may be disposed in the active region AR vertically underneath a portion of the gate structure GS and another portion of the second LDD region 23 may be disposed in the active region AR so as not to be vertically underneath the gate structure GS in a vertical direction. The first and second LDD regions 21 and 23 may be disposed at opposite sides of the well region W, respectively. Each of the first and second LDD regions 21 and 23 may surround one side surface and a bottom surface of a corresponding one of the source region SR and the drain region DR. The first and second LDD regions 21 and 23 may include the same second-conductivity-type impurities as the source region SR and the drain region DR, respectively. However, the impurity concentration of the first and second LDD regions 21 and 23 may be lower than the impurity concentration of the source region SR and the drain region DR, respectively.

The first LDD region 21 may be disposed adjacent to the drain region DR. The first LDD region 21 may surround one side surface and the bottom surface of the drain region DR. In some exemplary embodiments, the first LDD region 21 may contact the one side surface and the bottom surface of the drain region DR. The second LDD region 23 may be disposed adjacent to the source region SR. The second LDD region 23 may surround one side surface and the bottom surface of the source region SR. In some exemplary embodiments, the second LDD region 23 may contact the one side surface and the bottom surface of the source region SR. The first LDD region 21 and the second LDD region 23 may be spaced apart from each other under the condition that the well region W is interposed therebetween.

The first LDD region 21 and the second LDD region 23 may have different junction depths, respectively. Here, the term "junction depths" may denote vertical distances from top surfaces of the first and second LDD regions 21 and 23 (or a top surface TS of the semiconductor substrate 10) to bottom surfaces or lower ends of the first and second LDD regions 21 and 23. For example, the first LDD region 21 may have a greater junction depth than the second LDD region 23. A first junction depth H1 of the first LDD region 21 may be about 900 Å to about 1,100 Å, and a second junction depth H3 of the second LDD region 23 may be about 40 Å to about 60 Å.

The first and second halo regions 31 and 33 may be disposed in the active region AR adjacent to the first and second LDD regions 21 and 23, respectively. The first and second halo regions 31 and 33 may be formed to contact lower portions of the first and second LDD regions 21 and 23, respectively. The first and second halo regions 31 and 33 may be formed to extend toward the well region W. Each of the first and second halo regions 31 and 33 may be formed to surround a portion of the bottom surface of a corresponding one of the first and second LDD regions 21 and 23 and/or a portion of a side surface of the corresponding one of the first and second LDD regions 21 and 23. The first and second halo regions 31 and 33 may include the same first-conductivity-type impurities as the well region W. For example, when the well region W includes p-type impurities, the first and second halo regions 31 and 33 may include p-type impurities. When the well region W includes n-type impurities, the first and second halo regions 31 and 33 may include n-type impurities. The concentration of impurities included in the first and second halo regions 31 and 33 may be higher than the concentration of impurities included in the well region W.

The first halo region 31 may be disposed adjacent to the first LDD region 21. The first halo region 31 may be formed to contact a lower portion of the first LDD region 21. The first halo region 31 may extend toward the well region W. The first halo region 31 may extend in a direction away from the top surface of the semiconductor substrate 10. In some exemplary embodiments, the first halo region 31 may extend in a diagonal direction away from a location of the drain region DR. The first halo region 31 may surround a portion of a bottom surface of the first LDD region 21 and a portion of one side surface 21S of the first LDD region 21. In some exemplary embodiments, the first halo region 31 may contact the portion of the bottom surface of the first LDD region 21 and the portion of the one side surface 21S of the first LDD region. In some exemplary embodiments, the first halo region 31 thus may be disposed to surround and contact a corner of the first LDD region 21.

The second halo region 33 may be disposed adjacent to the second LDD region 23. The second halo region 33 may be disposed adjacent to a lower portion of the second LDD region 23. The second halo region 33 may extend toward the well region W. The second halo region 33 may extend in a direction away from the top surface of the semiconductor substrate 10. In some exemplary embodiments, the second halo region 33 may extend in a diagonal direction away from a location of the source region SR. The second halo region 33 may surround a portion of a bottom surface of the second LDD region 23. In some exemplary embodiments, the second halo region 33 may surround a portion of one side surface 23S of the second LDD region 23 (see, e.g., FIGS. 2-3). In some exemplary embodiments, the second halo region 33 thus may be disposed to surround and contact a corner of the second LDD region 23 (see, e.g., FIGS. 2-3). The first halo region 31 and the second halo region 33 may be spaced apart from each other under the condition that the well region W is interposed therebetween.

The first halo region 31 and the second halo region 33 may be disposed at different levels respectively with reference to a bottom surface BS of the semiconductor substrate 10. The first halo region 31 may be disposed at a level closer to the bottom surface BS of the semiconductor substrate 10 than the second halo region 33.

The first halo region 31 and the second halo region 33 may have different junction depths, respectively. Here, the term "junction depths" may denote vertical distances from the top surface TS of the semiconductor substrate 10 to lower ends of the first and second halo regions 31 and 33. For example, the first halo region 31 may have a greater junction depth than the second halo region 33. A third junction depth H2 of the first halo region 31 may be about 1,800 Å to about 2,000 Å, and a fourth junction depth H4 of the second halo region 33 may be about 300 Å to about 350 Å. The third junction depth H2 of the first halo region 31 may be greater than the first junction depth H1 of the first LDD region 21. The fourth junction depth H4 of the second halo region 33 may be smaller than the first junction depth H1 of the first LDD region 21. The fourth junction depth H4 of the second halo region 33 may be greater than the second junction depth H3 of the second LDD region 23.

The gate structure GS may be disposed on the semiconductor substrate 10. The gate structure GS may be disposed on the active region AR. The gate structure GS may vertically overlap with the well region W. In some exemplary embodiments, the gate structure GS may completely vertically cover the well region W. The gate structure GS may vertically overlap with at least a portion of each of the first and second LDD regions 21 and 23 and with at least a portion of each of the first and second halo regions 31 and 33. In some exemplary embodiments, a portion of the first halo region 31 may be disposed in the active region AR vertically underneath a portion of the gate structure GS and another portion of the first halo region 31 may be disposed in the active region AR so as not to be vertically underneath the gate structure GS in a vertical direction. In some exemplary embodiments, a portion of the second halo region 33 may be disposed in the active region AR vertically underneath a portion of the gate structure GS and another portion of the second halo region 33 may be disposed in the active region AR so as not to be vertically underneath the gate structure GS in a vertical direction. The gate structure GS may have a flat bottom surface, and the top surface TS of the semiconductor substrate 10 contacting the flat bottom surface of the gate structure GS may also be flat. In some exemplary embodiments, the semiconductor device, which includes the above-described semiconductor substrate 10 and the above-described gate structure GS, may be a planar semiconductor device.

The gate structure GS may include a gate stack 40 and gate spacers SPa and SPb. The gate stack 40 may vertically overlap with the well region W. In some exemplary embodiments, the gate stack 40 may completely vertically cover the wall region W. In some exemplary embodiments, the gate stack 40 may not vertically overlap with the source region SR and the drain region DR, without being limited thereto. In some exemplary embodiments, the gate stack 40 may not vertically overlap with the first LDD region 21. For example, one side wall 40S1 of the gate stack 40 may be aligned with the one side surface 21S of the first LDD region 21. In other words, in some exemplary embodiments, the one side wall 40S1 of the gate stack 40 may be coplanar with the one side surface 21S of the first LDD region 21. Here, the one side wall 40S1 of the gate stack 40 may mean a side wall of the gate stack 40 that is adjacent to the first LDD region 21 from among side walls of the gate stack 40. The one side surface 21S of the first LDD region 21 means a side surface of the first LDD region 21 that is adjacent to the well region W from among side surfaces of the first LDD region 21. A portion of the gate stack 40 may vertically overlap with a portion of the second LDD region 23. The other side wall 40S2 of the gate stack 40, which is opposite to the one side wall 40S1, may be offset from the one side surface 23S of the second LDD region 23. In other words, in some exemplary embodiments, the one side surface 23S of the second LDD region 23 may be vertically underneath the gate stack 40. The one side surface 23S of the second LDD region 23 may mean a side surface of the second LDD region 23 that is adjacent to the well region W from among side surfaces of the second LDD region 23. The other side wall 40S2 of the gate stack 40 may be disposed on the second LDD region 23. The one side wall 40S1 and the other side wall 40S2 of the gate stack 40 may be offset from the one side surface 23S of the second LDD region 23. In other words, in some exemplary embodiments, the one side wall 40S1 and the other side wall 40S2 of the gate stack 40 may be vertically on opposite sides of the one side surface 23S of the second LDD region 23. A horizontal width X1 of the gate stack 40 may be about 0.3 μm to about 0.4 μm.

The gate stack 40 may include a gate dielectric layer 41 and a gate electrode 43. The gate dielectric layer 41 may be disposed on the active region AR. In some exemplary embodiments, the gate dielectric layer 41 may contact the active region AR. In some exemplary embodiments, the gate dielectric layer 41 may be disposed directly on the active region AR. The gate dielectric layer 41 may include at least one of a silicon oxide film and a high dielectric material. The high dielectric material may be constituted by a material having a higher dielectric constant than the silicon oxide film. For example, the high dielectric material may include at least one of hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), or lead scandium tantalum oxide (PbScTaO). In an embodiment, the gate dielectric layer 41 may include a silicon oxide film disposed on the active region AR, a hafnium oxide film disposed on the silicon oxide film, and at least one high dielectric material film disposed on the hafnium oxide film.

The gate electrode 43 may be disposed on the gate dielectric layer 41. In some exemplary embodiments, the gate electrode 43 may contact the gate dielectric layer 41. In some exemplary embodiments, the gate electrode 43 may be disposed directly on the gate dielectric layer 41. The gate electrode 43 may be made of at least one material of polysilicon doped with impurities, Ti, TiN, Ta, TaN, W, WN, TiSiN, or WSiN.

A first gate spacer SPa and a second gate spacer SPb may be disposed at opposite side walls of the gate stack 40, respectively. The first and second gate spacers SPa and SPb may vertically overlap with portions of the first and second LDD regions 21 and 23, respectively. Outer side walls of the first and second gate spacers SPa and SPb may be aligned with side surfaces of the source region SD and the drain region DR, respectively, without being limited thereto. The first and second gate spacers SPa and SPb may not vertically overlap with the well region W. In other words, in some exemplary embodiments, the first and second gate spacers SPa and SPb may be disposed, respectively, to opposite sides of the well region W.

The first gate spacer SPa may be disposed on one side surface 40S1 of the gate stack 40. The first gate spacer SPa may vertically overlap with a portion of the first LDD region 21. The first gate spacer SPa may vertically overlap with a portion of the first halo region 31. An inner side wall of the first gate spacer SPa may be aligned with the one side surface 21S of the first LDD region 21. In other words, in some exemplary embodiments, the inner side wall of the first gate spacer SPa may be coplanar with the one side surface 21S of the first LDD region 21. The second gate spacer SPb may be disposed on the other side wall 40S2 of the gate stack 40. The second gate spacer SPb may vertically overlap with a portion of the second LDD region 23. The second gate spacer SPb may vertically overlap with a portion of the second halo region 33. An inner side wall of the second gate spacer SPb may be offset from the one side surface 23S of the second LDD region 23. The inner side wall of the second gate spacer SPb may be disposed on the second LDD region 23.

Each of the first gate spacer SPa and the second gate spacer SPb may include an inner gate spacer SP1, an intermediate gate spacer SP2, and an outer gate spacer SP3. The inner gate spacer SP1 may be directly disposed on a corresponding one of the side walls 40S1 and 40S2 of the gate stack 40. The intermediate gate spacer SP2 may be disposed on the inner gate spacer SP1. The outer gate spacer SP3 may be disposed on the intermediate gate spacer SP2. The intermediate gate spacer SP2 may be disposed between the inner gate spacer SP1 and the outer gate spacer SP3. The inner gate spacer SP1 and the outer gate spacer SP3 may include silicon nitride, and the intermediate gate spacer SP2 may include silicon oxide.

Figure 2:
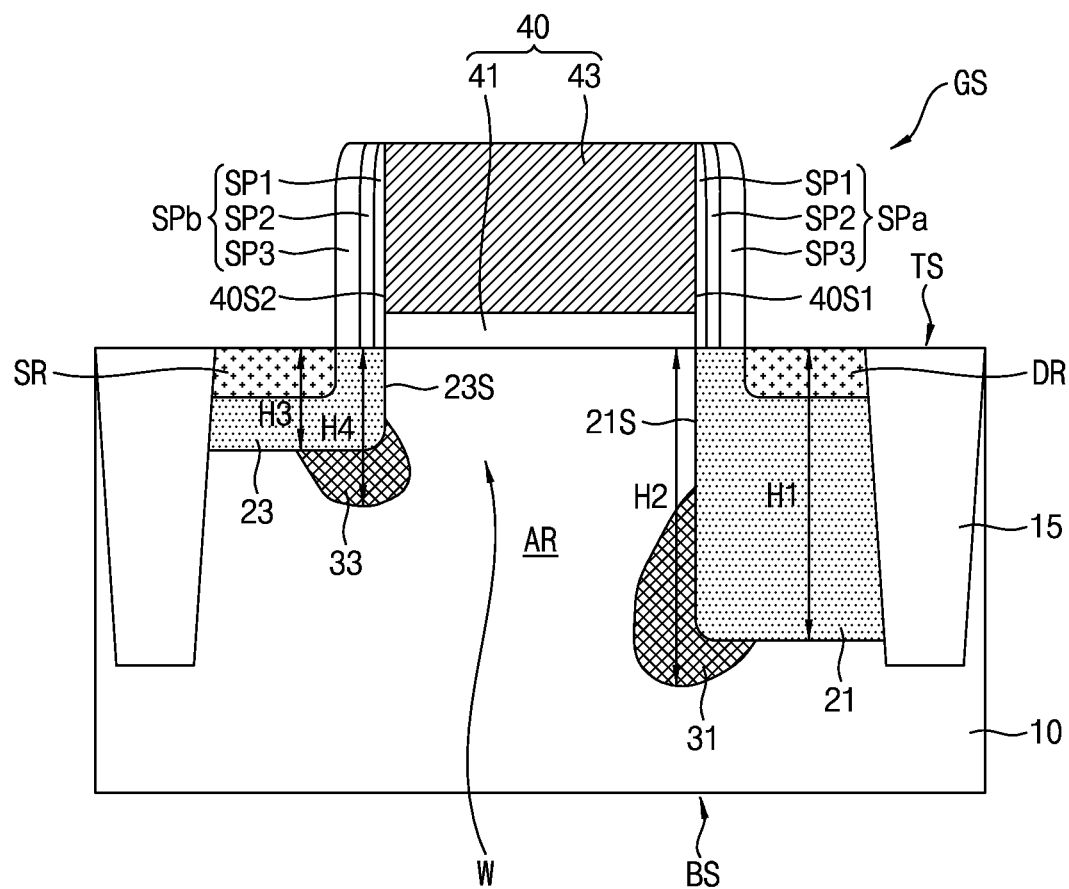
FIG. 2 is a sectional view of a semiconductor device according to an exemplary embodiment.

FIG. 2 is a sectional view of a semiconductor device according to an exemplary embodiment.

Referring to FIG. 2, the gate stack 40 may not vertically overlap with the first and second LDD regions 21 and 23. The one side wall 40S1 of the gate stack 40 may be aligned with the one side surface 21S of the first LDD region 21. In other words, in some exemplary embodiments, the one side wall 40S1 of the gate stack 40 may be coplanar with the one side surface 21S of the first LDD region 21. The other side wall 40S2 of the gate stack 40 may be aligned with the one side surface 23S of the second LDD region 23. In other words, in some exemplary embodiments, the other side wall 40S2 of the gate stack 40 may be coplanar with the one side surface 23S of the second LDD region 23. The gate stack 40 may vertically overlap with a portion of each of the first halo region 31 and the second halo region 33. For example, a portion of the first halo region 31 may be vertically underneath the gate stack 40 and another portion of the first halo region 31 may not be vertically underneath the gate stack 40. A portion of the second halo region 33 may be vertically underneath the gate stack 40 and another portion of the second halo region 33 may not be vertically underneath the gate stack 40. The remaining configuration of the exemplary embodiment illustrated in FIG. 2 is functionally and structurally similar to the exemplary embodiment illustrated in FIG. 1, and therefore repeated description thereof is omitted for conciseness.

Figure 3:
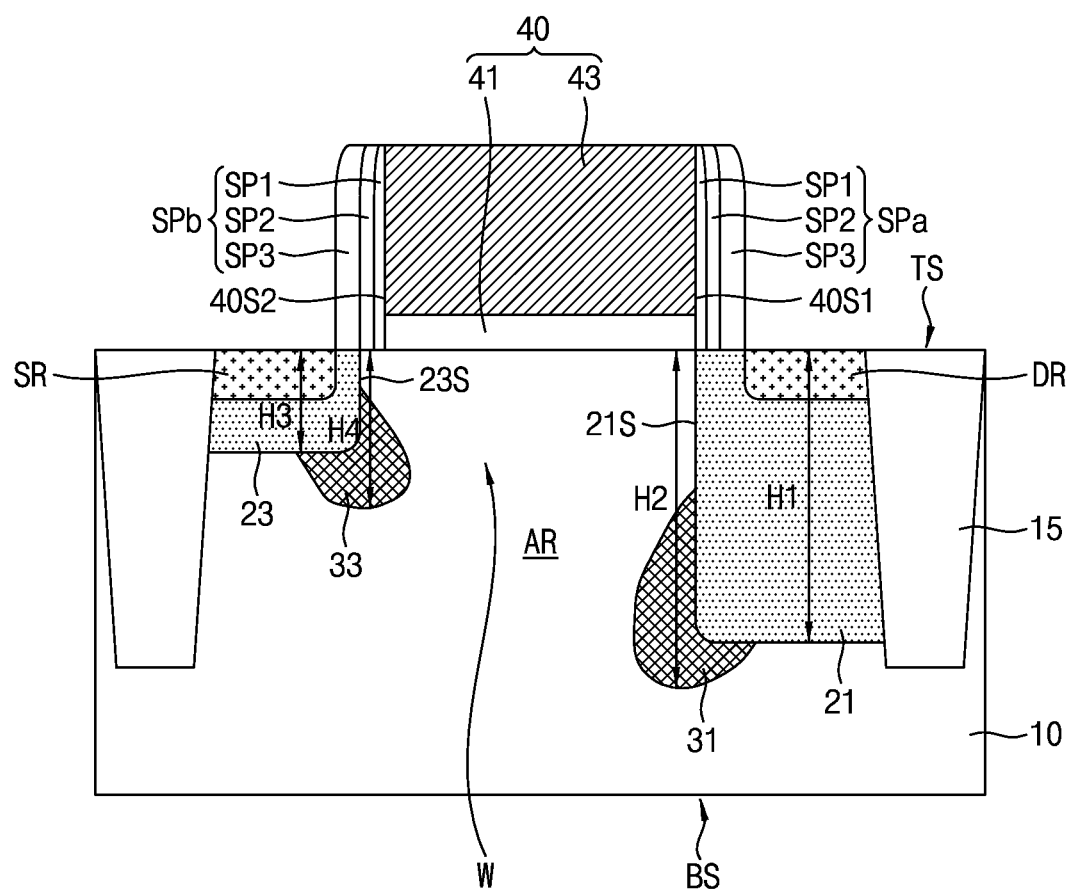
FIG. 3 is a sectional view of a semiconductor device according to an exemplary embodiment.

FIG. 3 is a sectional view of a semiconductor device according to an exemplary embodiment.

Referring to FIG. 3, the one side surface 23S of the second LDD region 23 may be offset from the other side surface 40S2 of the gate stack 40. The second LDD region 23 may not vertically overlap with the inner gate spacer SP1 of the second gate spacer SPb. The second LDD region 23 may not vertically overlap with the intermediate gate spacer SP2 of the second gate spacer SPb. The one side surface 23S of the second LDD region 23 may be aligned with an outer side wall of the intermediate gate spacer SP2 of the second gate spacer SPb. In other words, in some exemplary embodiments, the one side surface 23S of the second LDD region 23 may be coplanar with the outer side wall of the intermediate gate spacer SP2 of the second gate spacer SPb. The one side surface 23S of the second LDD region 23 may be aligned with an inner side wall of the outer gate spacer SP3 of the second gate spacer SPb. In other words, in some exemplary embodiments, the one side surface 23S of the second LDD region 23 may be coplanar with the inner side wall of the outer gate spacer SP3 of the second gate spacer SPb. The remaining configuration of the exemplary embodiment illustrated in FIG. 3 is functionally and structurally similar to the exemplary embodiment illustrated in FIG. 1, and therefore repeated description thereof is omitted for conciseness.

FIGS. 4 to 11 are sectional views explaining a method for manufacturing a semiconductor device in accordance with an exemplary embodiment.

Figure 4:
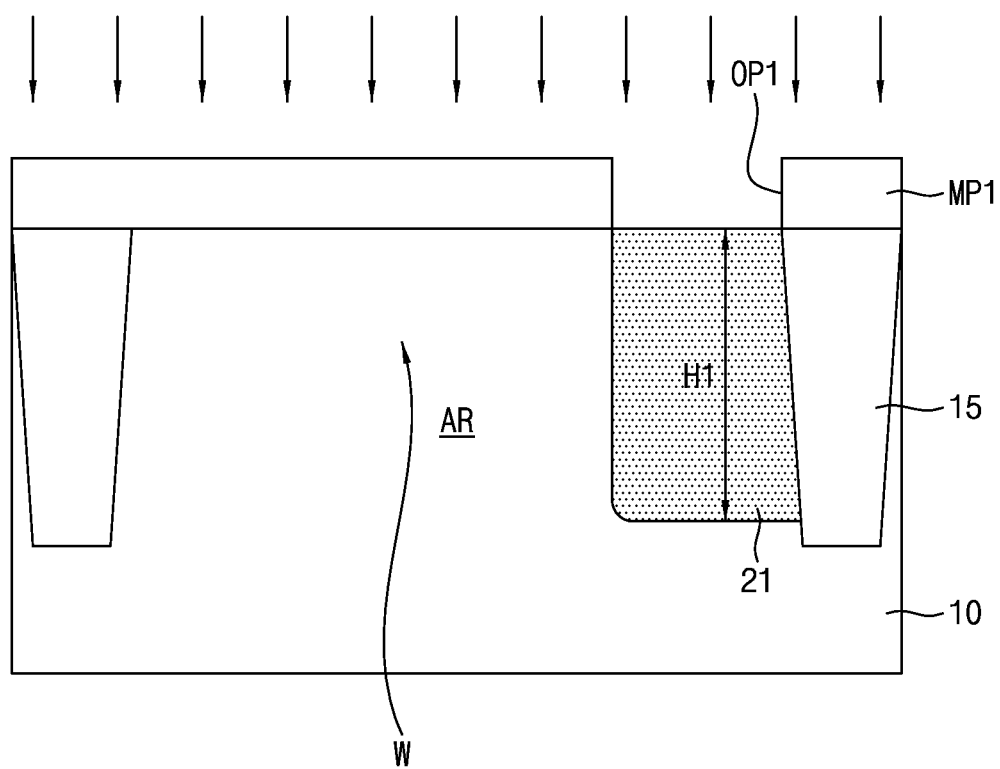
FIGS. 4 to 11 are sectional views explaining a method for manufacturing a semiconductor device in accordance with an exemplary embodiment.

Referring to FIG. 4, the method may include forming the element isolation layer 15 defining the active region AR in the semiconductor substrate 10. For example, the semiconductor substrate 10 may be formed of a silicon wafer including p-type impurity ions or n-type impurity ions. The active region AR of the semiconductor substrate 10 may include a well region W including first-conductivity-type impurity ions. The first conductivity type may be n type or p type.

The element isolation layer 15 may be formed through shallow trench isolation (STI). For example, the element isolation layer 15 may include silicon oxide, silicon nitride, silicon oxynitride, or a combination thereof. The element isolation layer 15 may be formed of a high density plasma oxide.

The method may include forming the first lightly doped drain (LDD) region 21 in the active region AR through a first LDD ion implantation process. A first mask pattern MP1 may be formed on the semiconductor substrate 10, and the first LDD ion implantation process may be performed using the first mask pattern MP1 as an ion implantation mask. The first mask pattern MP1 may include an opening OP1 exposing a portion of a top surface of the semiconductor substrate 10. As ions are implanted in the semiconductor substrate 10 through the opening OP1, the first LDD region 21 may be formed. The first LDD ion implantation process may be performed such that ions are implanted in the semiconductor substrate 10 under the condition that the ions are directed to be perpendicular to the top surface of the semiconductor substrate 10. Accordingly, the first LDD region 21 may be formed in the active region AR at a position vertically overlapping with the opening OP1 of the first mask pattern MP1. The first LDD region 21 may be formed to include second-conductivity-type impurity ions different from those of the well region W of the semiconductor substrate 10. The second conductivity type may be n type or p type. For example, when the well region W of the semiconductor substrate 10 includes p-type impurity ions, the first LDD region 21 may include n-type impurity ions. The first LDD region 21 may be formed to have a junction depth to achieve a breakdown voltage level. In some exemplary embodiments, the breakdown voltage level may be predetermined. The first LDD region 21 may be formed to have the first junction depth H1. The first junction depth H1 may be about 900 Å to about 1,100 Å.

Figure 5:
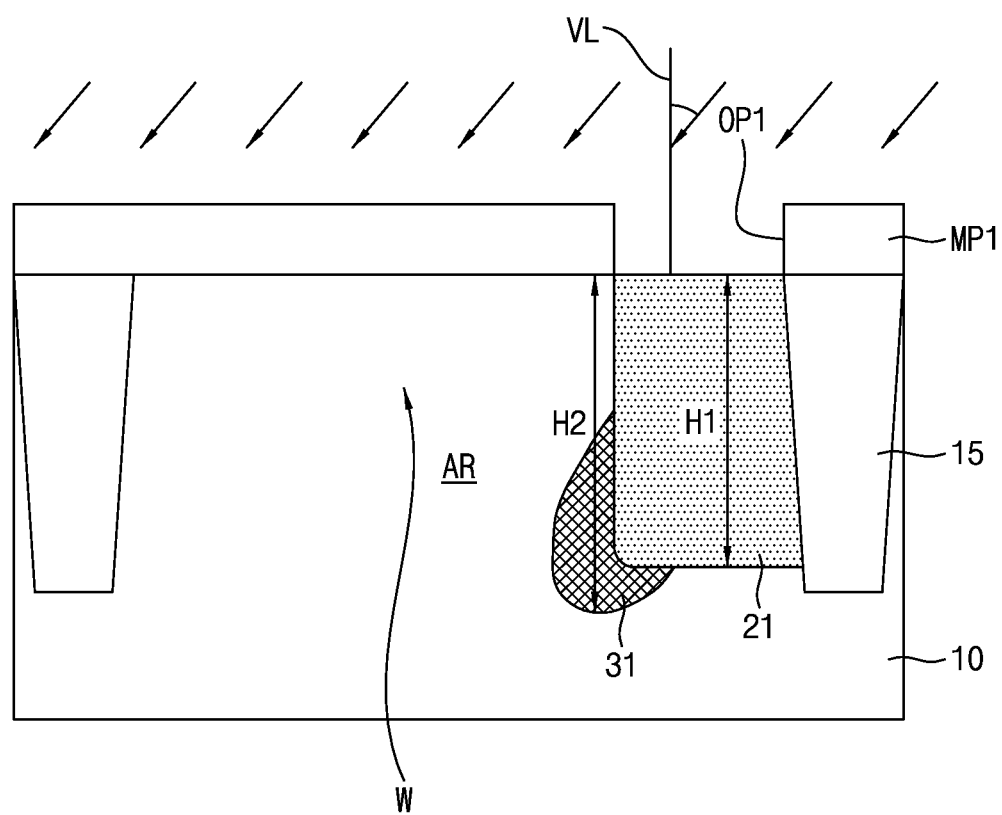

Referring to FIG. 5, the method may include forming the first halo region 31 in the active region AR through a first halo ion implantation process. The first halo ion implantation process may be performed using the first mask pattern MP1 as an ion implantation mask. The first halo ion implantation process may be performed using various angles and various levels of energy. The first halo ion implantation process may be a tilt ion implantation process. For example, the first halo ion implantation process may be performed such that ions are implanted in the semiconductor substrate 10 under the condition that the ions form a tilt of about 15° to about 45° with respect to a normal line VL perpendicular to the top surface of the semiconductor substrate 10. Accordingly, the first halo region 31 may be formed such that at least a portion of the first halo region 31 vertically overlaps with the first mask pattern MP1. The first halo region 31 may be formed at one side portion and a lower portion of the first LDD region 21. For example, the first halo region 31 may be formed at a left lower portion of the first LDD region 21 with reference to FIG. 5. The first halo region 31 may be formed to have the second junction depth H2. The second junction depth H2 may be greater than the first junction depth H1. For example, the second junction depth H2 may be about 1,800 Å to about 2,000 Å.

The first halo region 31 may be formed to include the same first-conductivity-type impurity ions as the well region W. For example, when the well region W includes p-type impurity ions, the first halo region 31 may include p-type impurity ions. The impurity concentration of the first halo region 31 may be higher than the impurity concentration of the well region W.

Although the first halo region 31 is shown as being formed after formation of the first LDD region 21 with reference to FIGS. 4 and 5, this is only an example and, in some exemplary embodiments, the first halo region 31 may be formed before formation of the first LDD region 21.

The method may include an annealing process performed after formation of the first LDD region 21 and the first halo region 31. For example, the annealing process may be formed after the first halo ion implantation process. The annealing process may be a thermal treatment process for the well region W. The annealing process may be performed for 5 seconds at about 1,000° C. to about 1,100° C.

The first mask pattern MP1 may be removed after formation of the first halo region 31. The first mask pattern MP1 may be removed before the annealing process or may be removed after the annealing process.

Figure 6:
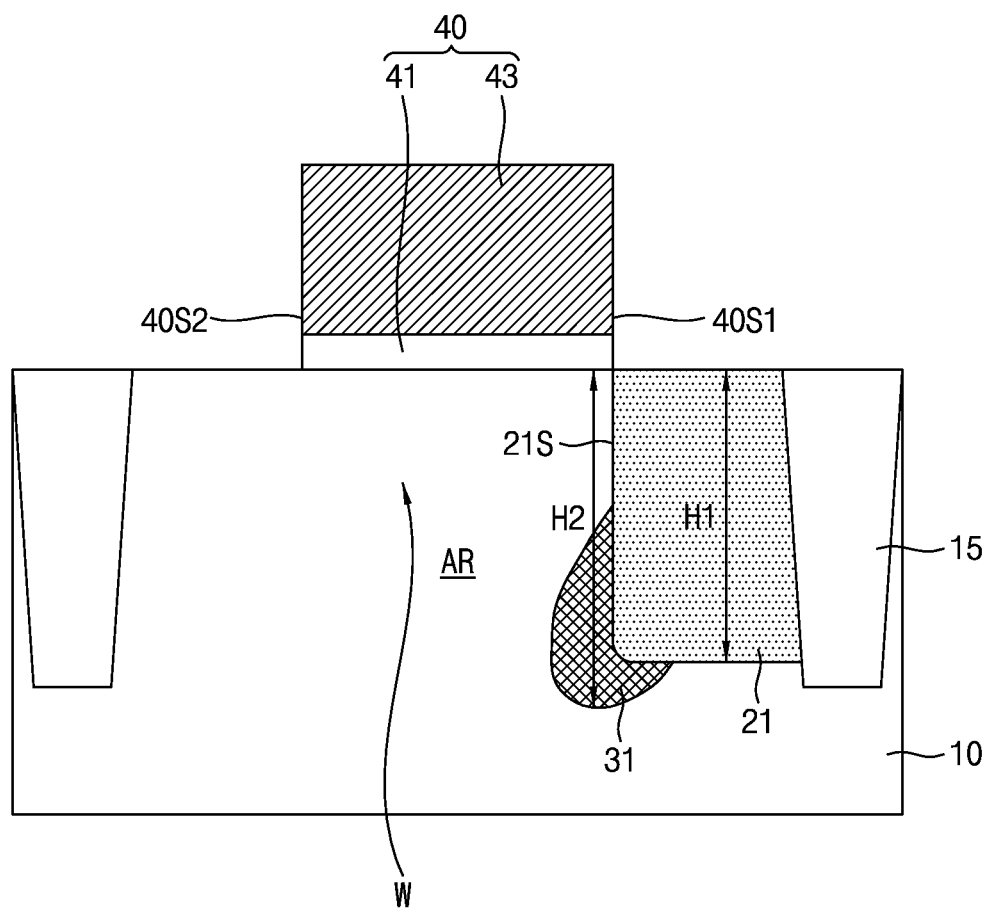

Referring to FIG. 6, the method may include forming the gate stack 40. The gate stack 40 may include the gate dielectric layer 41 and the gate electrode 43. Formation of the gate stack 40 may include forming the gate dielectric layer 41 on the semiconductor substrate 10, and forming the gate electrode 43 on the gate dielectric layer 41. For example, the gate dielectric layer 41 may be formed using an atomic layer deposition (ALD) method or a chemical oxidation film formation method. The gate electrode 43 may be formed using an ALD process, a metal organic ALD (MOALD) process, a chemical vapor deposition (CVD) process, a metal organic CVD (MOCVD) process, or a physical vapor deposition (PVD) process, without being limited thereto. The gate stack 40, which includes the gate dielectric layer 41 and the gate electrode 43, may be formed by forming a dielectric layer on the semiconductor substrate 10, forming an electrode layer on the dielectric layer, and then etching a portion of each of the dielectric layer and the electrode layer. The process of etching the dielectric layer and the electrode layer may be an anisotropic etching process.

The gate stack 40 may be formed such that the gate stack 40 does not vertically overlap with the first LDD region 21. That is, the gate stack 40 may be formed to expose the top surface of the first LDD region 21. In an embodiment, the gate stack 40 may be formed such that one side wall 40S1 thereof is aligned with one side surface 21S of the first LDD region 21. In some exemplary embodiments, the gate stack 40 may be formed such that the one side wall 40S1 of the gate stack 40 is coplanar with the one side surface 21S of the first LDD region 21. The gate stack 40 may be formed to expose a portion of the top surface of the semiconductor substrate 10. The semiconductor substrate 10 may be exposed in a region adjacent to the other side wall 40S2 of the gate stack 40 opposite to one side wall 40S1 of the gate stack 40. Since the gate stack 40 is formed such that the gate stack 40 does not vertically overlap with the first LDD region 21, and the one side wall 40S1 of the gate stack 40 is aligned with the one side surface 21S of the first LDD region 21, the gate stack 40 may be formed to have a minimum size used for formation of a high-voltage transistor.

Figure 7:
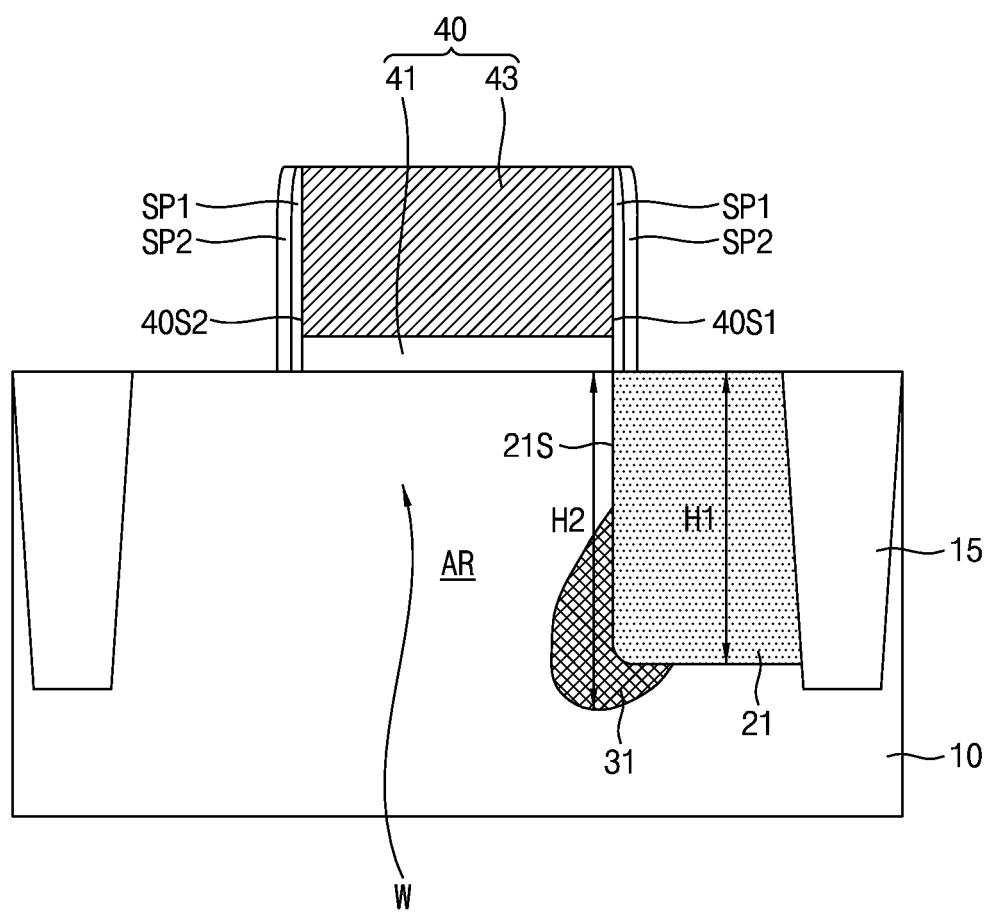

Referring to FIG. 7, the method may include forming the inner gate spacers SP1 and the intermediate gate spacers SP2. The inner gate spacers SP1 may be formed on opposite side walls of the gate stack 40, respectively. The intermediate gate spacers SP2 may be disposed on the inner gate spacers SP1, respectively. The intermediate gate spacers SP2 may be spaced apart from the gate stack 40 by the inner gate spacers SP1. The inner gate spacers SP1 and the intermediate gate spacers SP2 may be formed by forming spacer films covering the semiconductor substrate 10 and the gate stack 40, and then partially etching the spacer films until the top surface of the semiconductor substrate 10 and a top surface of the gate stack 40 are exposed. The process of etching the spacer films may be an anisotropic etching process.

Figure 8:
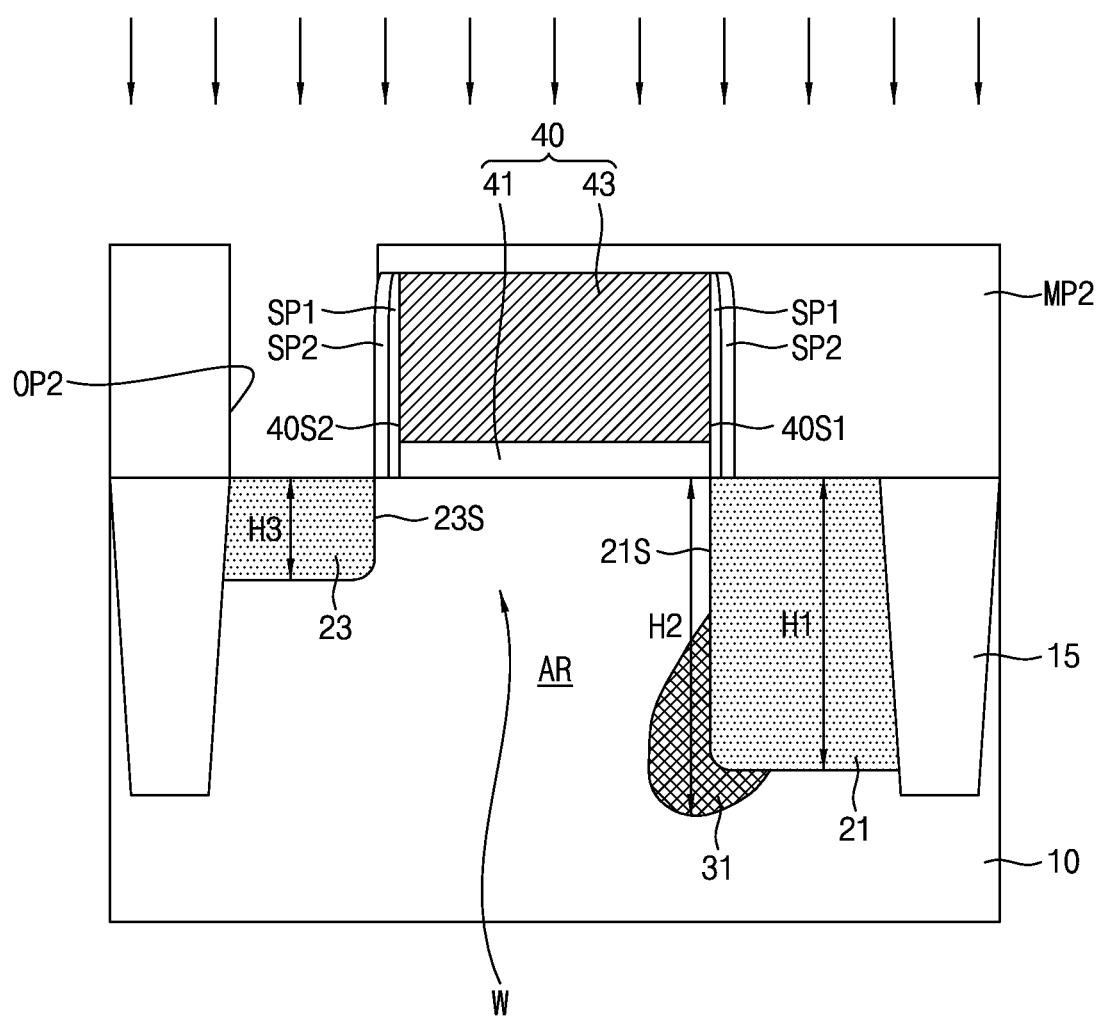

Referring to FIG. 8, the method may include forming the second LDD region 23 in the active region AR through a second LDD ion implantation process. A second mask pattern MP2 covering the gate stack 40, the inner gate spacers SP1 and the intermediate gate spacers SP2 may be formed on the semiconductor substrate 10, and the second LDD ion implantation process may be performed using the second mask pattern MP2 as an ion implantation mask. The second mask pattern MP2 may include an opening OP2 exposing a portion of the top surface of the semiconductor substrate 10. The opening OP2 may be formed to expose a portion of the active region AR adjacent to the other side wall 40S2 of the gate stack 40 opposite to the one side wall 40S1 of the gate stack 40 adjacent to the first LDD region 21. The opening OP2 may expose at least a portion of the intermediate gate spacer SP2 disposed on the other side wall 40S2 of the gate stack 40. As ions are implanted in the semiconductor substrate 10 through the opening OP2, the second LDD region 23 may be formed. The second LDD ion implantation process may be performed such that ions are implanted in the semiconductor substrate 10 under the condition that the ions are directed to be perpendicular to the top surface of the semiconductor substrate 10. Accordingly, the second LDD region 23 may be formed in the active region AR at a position vertically overlapping with the opening OP2 of the second mask pattern MP2. The one side surface 23S of the second LDD region 23 may be aligned with the outer side wall of the intermediate gate spacer SP2 disposed on the other side wall 40S2 of the gate stack 40. In some exemplary embodiments, the one side surface 23S of the second LDD region 23 may be coplanar with the outer side wall of the intermediate gate spacer SP2 disposed on the other side wall 40S2 of the gate stack 40. The second LDD region 23 may be formed to have the third junction depth H3. The third junction depth H3 may be smaller than the first junction depth H1. The third junction depth H3 may be about 40 Å to about 60 Å.

Figure 9:
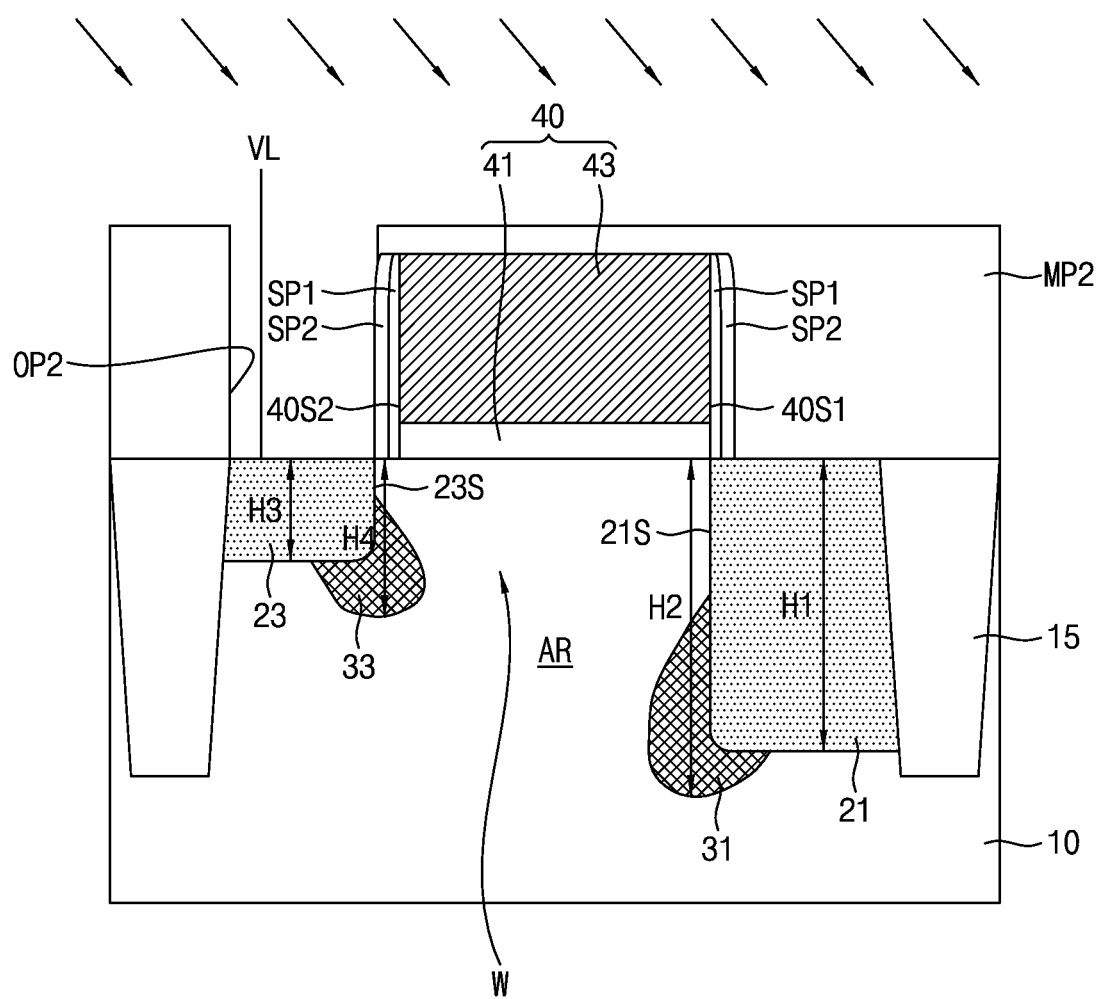

Referring to FIG. 9, the method may include forming the second halo region 33 in the active region AR through a second halo ion implantation process. The second halo ion implantation process may be performed using the second mask pattern MP2 as an ion implantation mask. The second halo ion implantation process may be performed using various angles and various levels of energy. The second halo ion implantation process may be a tilt ion implantation process. For example, the second halo ion implantation process may be performed such that ions are implanted in the semiconductor substrate 10 under the condition that the ions form a tilt of about 20° to about 30° with respect to the normal line VL perpendicular to the top surface of the semiconductor substrate 10. Accordingly, the second halo region 33 may be formed such that at least a portion thereof overlaps with the inner gate spacer SP1, the intermediate gate spacer SP2 and the gate stack 40. The second halo region 33 may be formed to have the fourth junction depth H4. The fourth junction depth H4 may be greater than the third junction depth H3. The fourth junction depth H4 may be smaller than the first junction depth H1. The fourth junction depth H4 may be about 300 Å to about 350 Å. The second mask pattern MP2 may be removed after formation of the second halo region 33.

Figure 10:
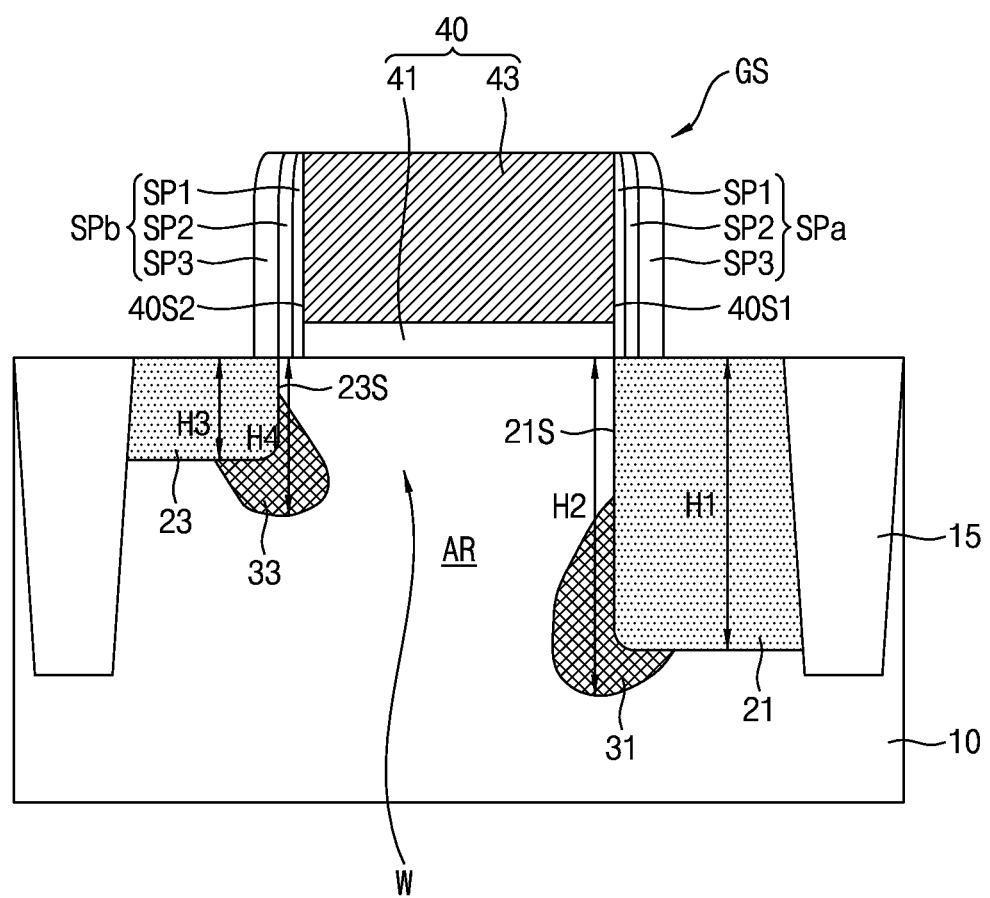

Referring to FIG. 10, the method may include forming the outer gate spacers SP3, thereby forming the gate structure GS. The gate structure GS may include the gate stack 40 and the first and second gate spacers SPa and SPb, and the first and second gate spacers SPa and SPb each may include the inner gate spacers SP1, the intermediate gate spacers SP2, and the outer gate spacers SP3. The outer gate spacers SP3 may be formed on the intermediate spacers SP2, respectively. The outer gate spacers SP3 may be formed to vertically overlap with a portion of the first LDD region 21 and a portion of the second LDD region 23, respectively. The outer gate spacers SP3 may be formed in the same manner as the process of forming the inner gate spacers SP1 and the intermediate spacers SP2, and thus a repeated description thereof is omitted for conciseness.

Figure 11:
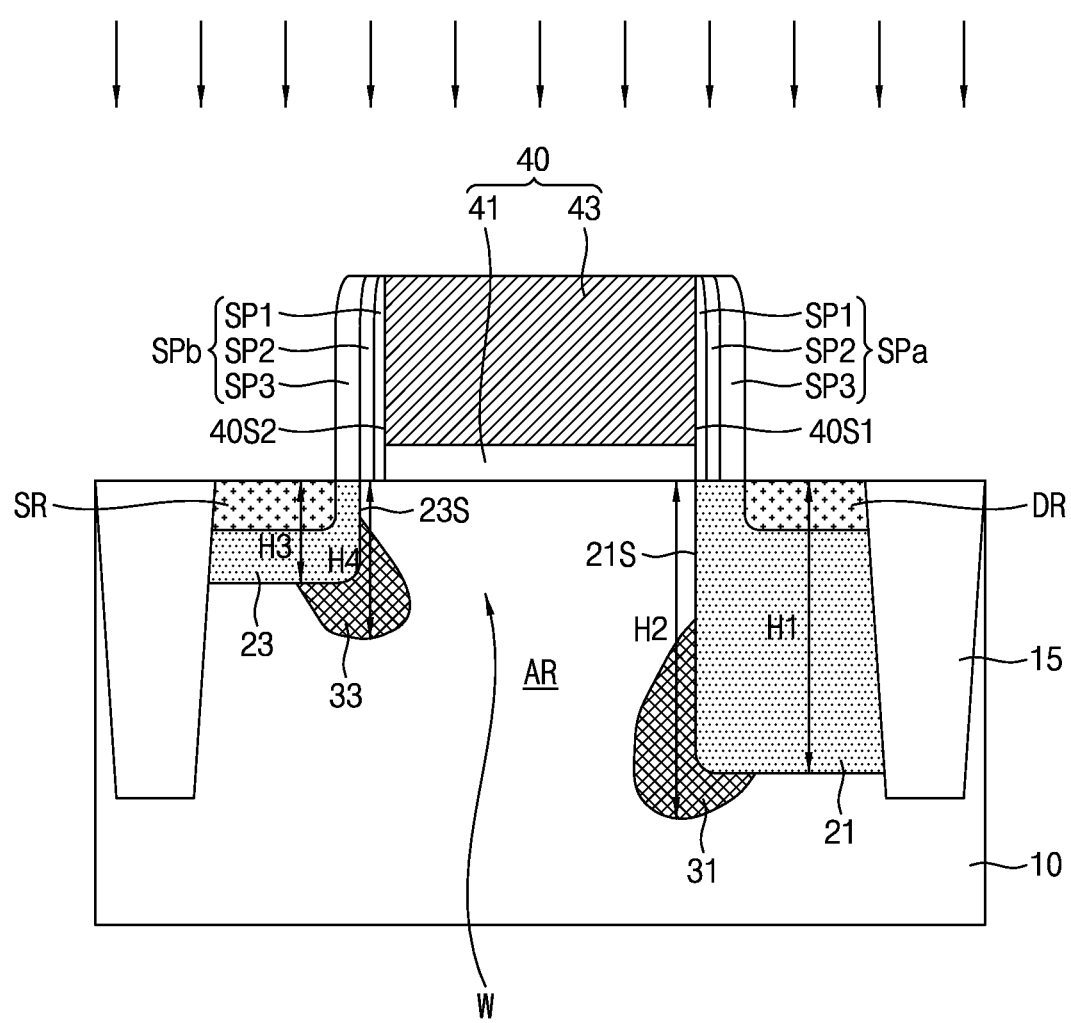

Referring to FIG. 11, the method may include forming the source region SR and the drain region DR through an ion implantation process using the gate structure GS as an ion implantation mask. The ion implantation process for formation of the source region SR and the drain region DR may be performed such that ions are implanted in the semiconductor substrate 10 under the condition that the ions are directed to be perpendicular to the top surface of the semiconductor substrate 10. The source region SR and the drain region DR may include the same second-conductivity-type impurities as the first and second LDD regions 21 and 23 while having a higher impurity concentration than the first and second LDD regions 21 and 23. The source region SR and the drain region DR may have the same junction depth. The junction depth of the source region SR and the drain region DR may be smaller than the third junction depth H3.

Figure 12:
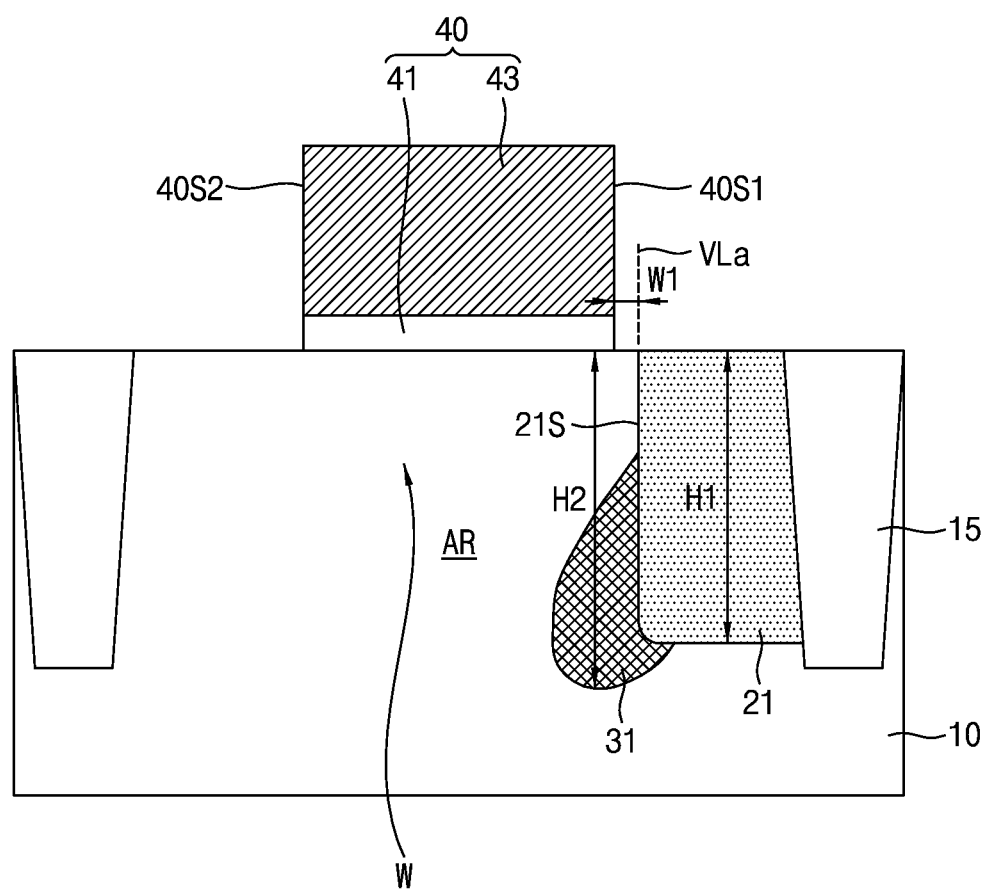
FIGS. 12 to 17 are sectional views explaining a method for manufacturing a semiconductor device in accordance with an exemplary embodiment.

FIGS. 12 to 17 are sectional views explaining a method for manufacturing a semiconductor device in accordance with an exemplary embodiment. FIG. 12 shows a process following the processes described with reference to FIGS. 4-5 described above. In other words, the processes of FIGS. 12-17 may be performed following the processes described with reference to FIGS. 4-5.

Referring to FIG. 12, the gate stack 40 may be formed such that the one side wall 40S1 of the gate stack 40 that is disposed adjacent to the first LDD region 21 is offset from the one side surface 21S of the first LDD region 21. The one side surface 21S of the first LDD region 21 may be a side surface disposed adjacent to the gate stack 40 from among side surfaces of the first LDD region 21. The one side wall 40S1 of the gate stack 40 may be spaced apart from a vertical line VLa aligned with the one side surface 21S of the first LDD region 21 by a horizontal distance W1. In some exemplary embodiments, the horizontal distance W1 may be predetermined. The horizontal distance W1 may correspond to a distance W2 (cf FIG. 17) by which the first LDD region 21 expands (or diffuses) horizontally as the drain region DR is subsequently formed.

Figure 13:
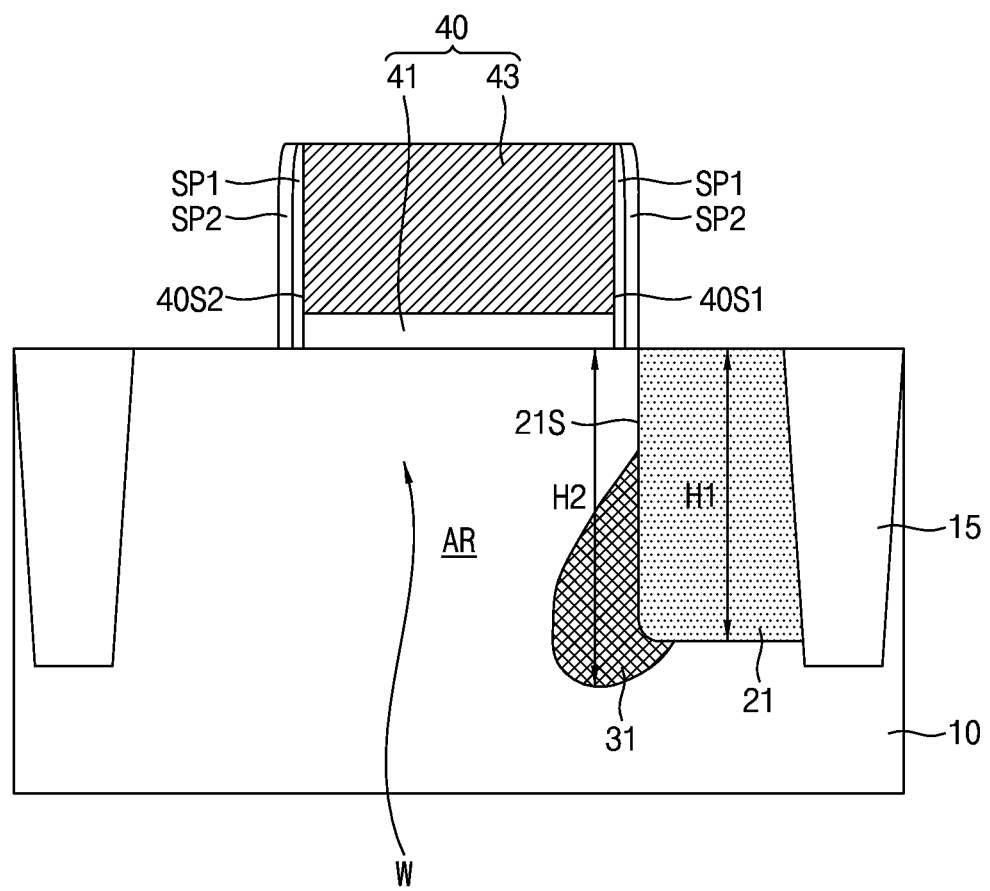

Referring to FIG. 13, the method may include forming the inner gate spacers SP1 and the intermediate gate spacers SP2. The inner gate spacers SP1 may be formed on opposite side walls of the gate stack 40, respectively. The intermediate gate spacers SP2 may be disposed on the inner gate spacers SP1, respectively.

In some exemplary embodiments, the outer side wall of the intermediate gate spacer SP2 disposed on the one side wall 40S1 of the gate stack 40 may be aligned with the one side surface 21S of the first LDD region 21. In some exemplary embodiments, the outer side wall of the intermediate gate spacer SP2 disposed on the one side wall 40S1 of the gate stack 40 may be coplanar with the one side surface 21S of the first LDD region 21. In this case, the sum of a thickness of the inner gate spacer SP1 and a thickness of the intermediate gate spacer SP2 disposed on the inner gate spacer SP1 may correspond to the distance W1 described with reference to FIG. 12.

In some exemplary embodiments, differently from the structure shown in FIG. 13, the inner gate spacer SP1 and/or the intermediate gate spacer SP2 disposed on the one side wall 40S1 of the gate stack 40 may be formed such that at least a portion thereof vertically overlaps with the first LDD region 21.

Figure 14:
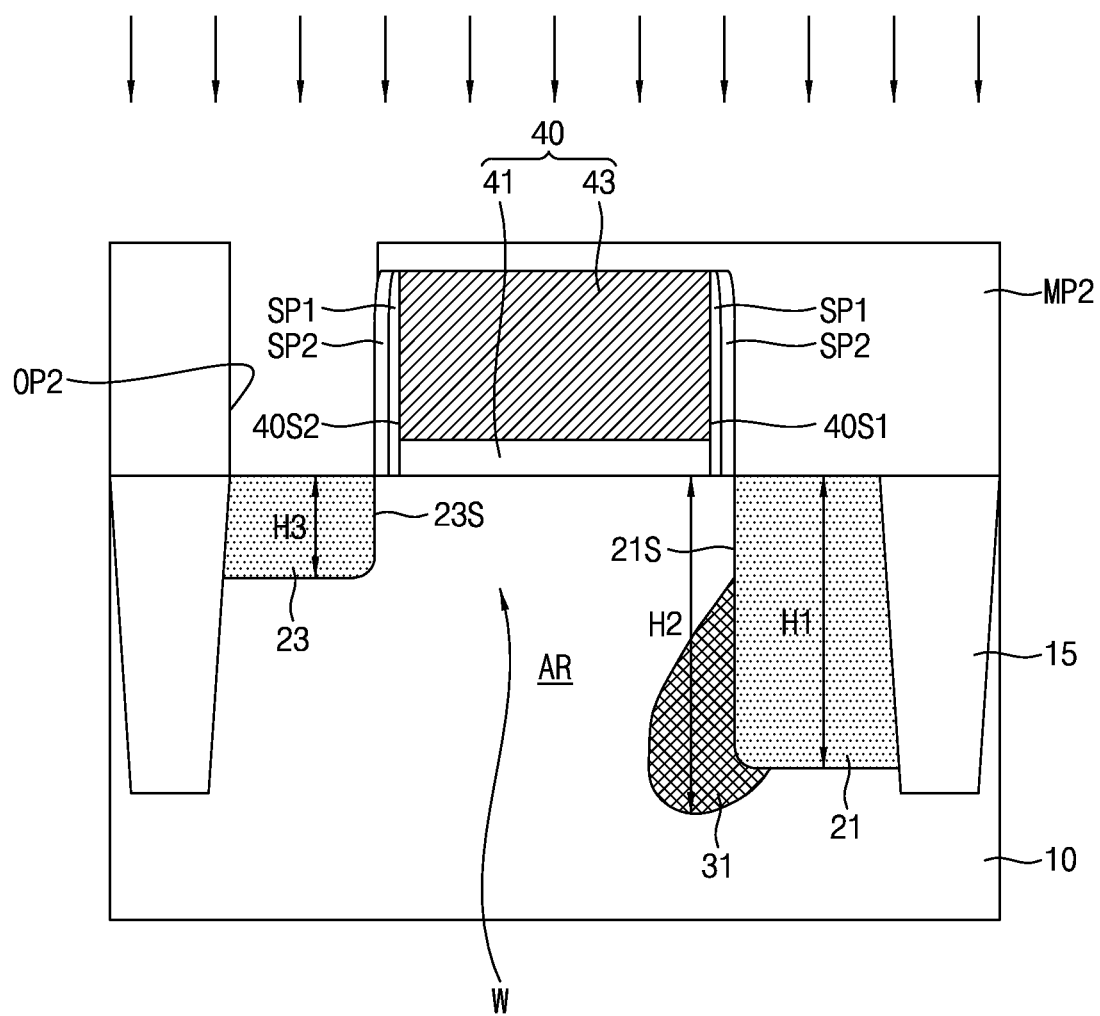

Referring to FIG. 14, the method may include forming the second LDD region 23 in the active region AR through a second LDD ion implantation process. The second LDD ion implantation process may be similar to that described above and therefore a repeated description thereof is omitted for conciseness.

Figure 15:
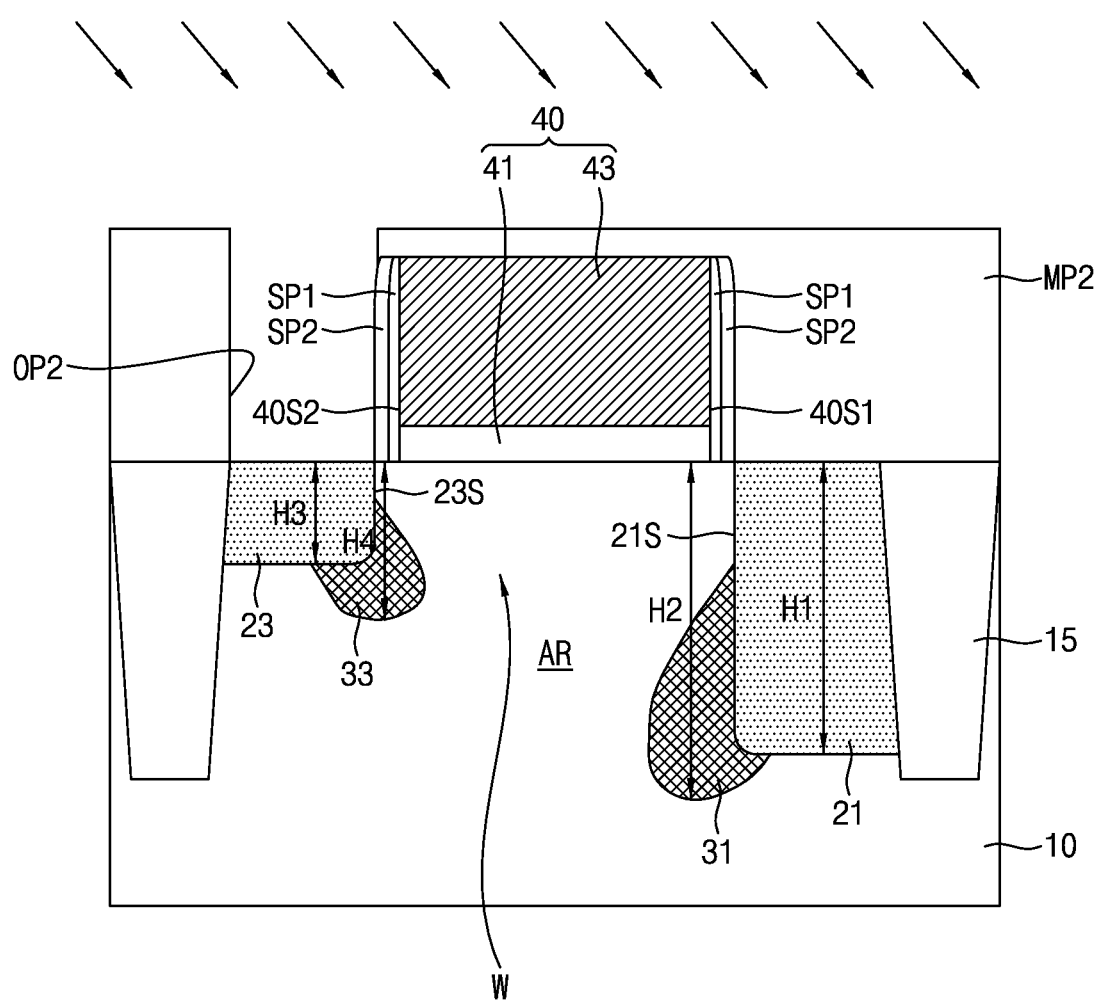

Referring to FIG. 15, the method may include forming the second halo region 33 in the active region AR through a second halo ion implantation process. The second halo ion implantation process may be similar to that described above and therefore a repeated description thereof is omitted for conciseness.

Figure 16:
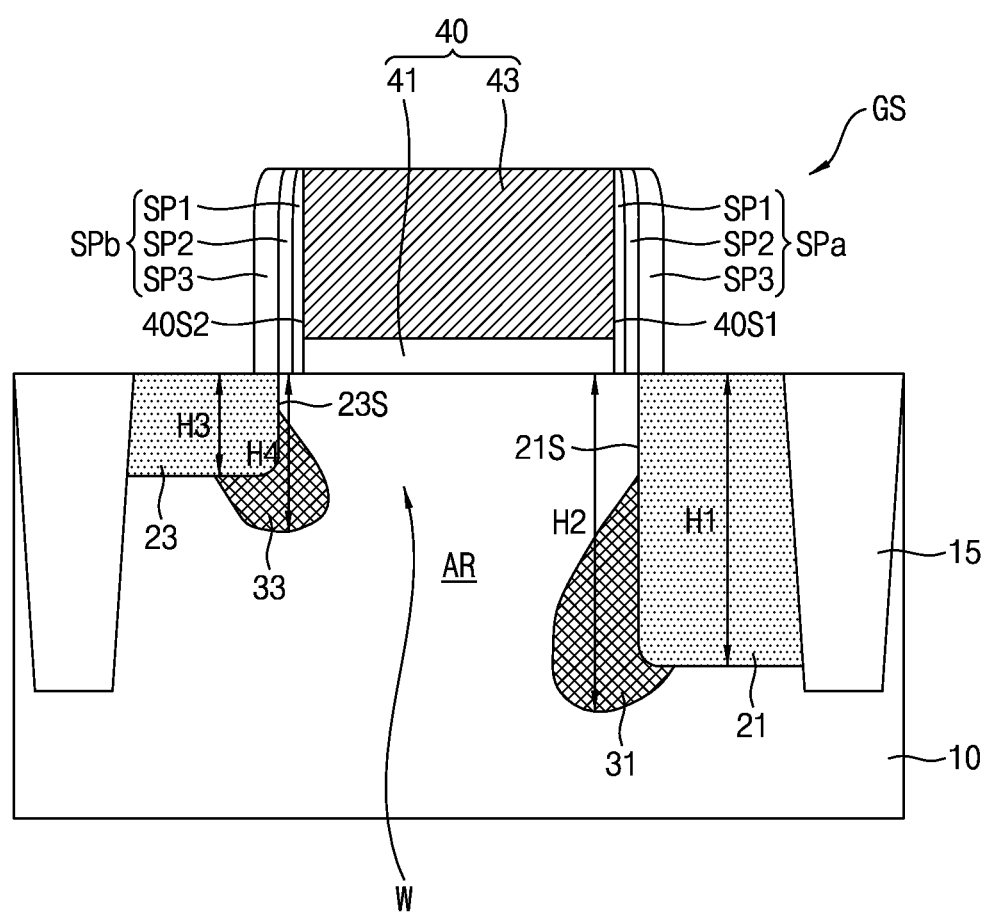

Referring to FIG. 16, the method may include forming the outer gate spacers SP3, thereby forming the gate structure GS. The processes of forming the outer gate spacers SP3 and thereby the gate structure GS may be similar to those described above and therefore a repeated description thereof is omitted for conciseness.

Figure 17:
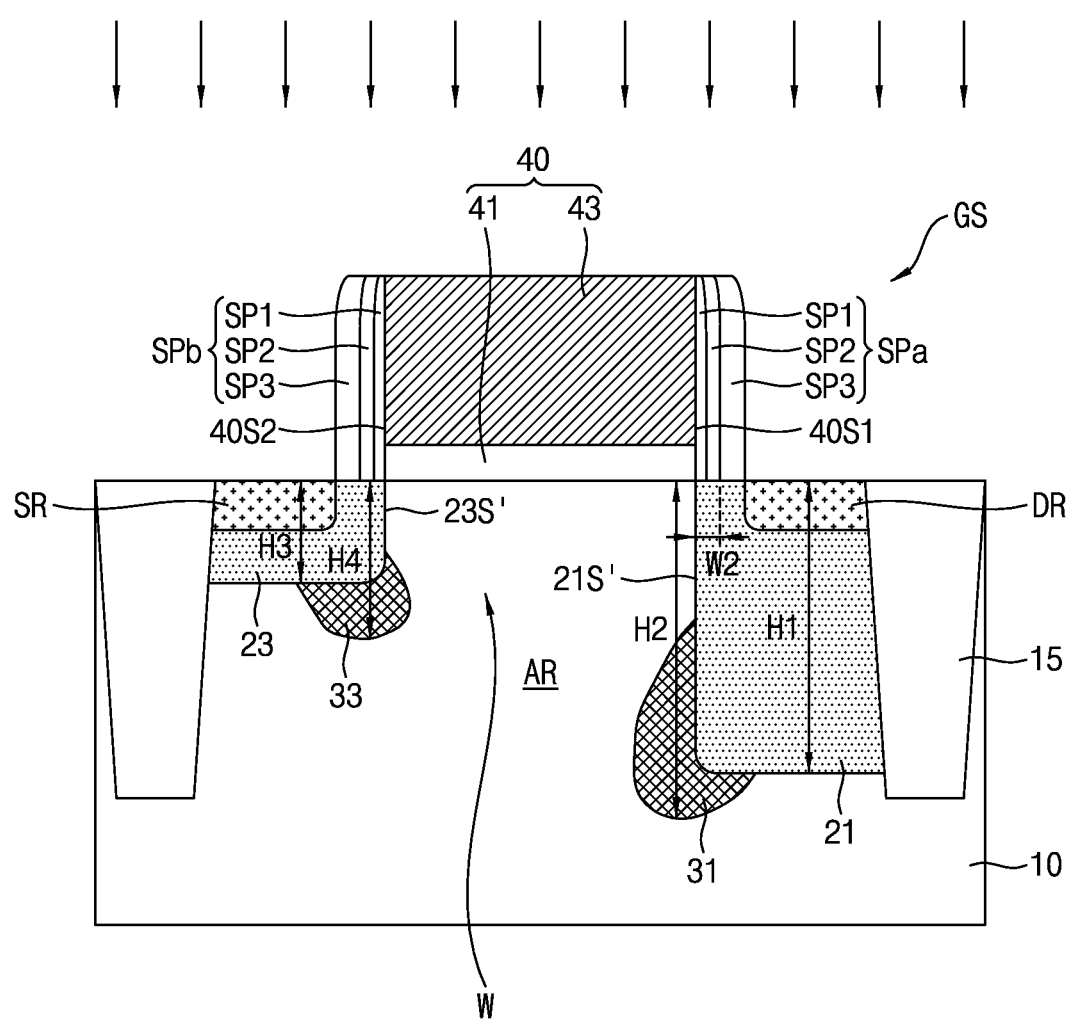

Referring to FIG. 17, the method may include forming the source region SR and the drain region DR through an ion implantation process using the gate structure GS as an ion implantation mask.

Since the source region SR and the drain region DR are formed through implantation of ions in a higher concentration than the impurity concentration of the first and second LDD regions 21 and 23 and at a higher level of energy than a level of energy used for formation of the first and second LDD regions 21 and 23, at least a part of the impurities in the first and second LDD regions 21 and 23 may be forced to escape from a position of the first and second LDD regions 21 and 23 before formation of the source region SR and the drain region DR. That is, the impurities of the first and second LDD regions 21 and 23 may diffuse into a well region W (or the active region AR). Accordingly, first and second side surfaces 21S' and 23S' of the first and second LDD regions 21 and 23, respectively, may shift toward the well region W. The first and second LDD regions 21 and 23 may horizontally expand. In accordance with a horizontal expansion of the first and second LDD regions 21 and 23, the first and second side surfaces 21S' and 23S' of the first and second LDD regions 21 and 23 may be aligned with side surfaces of the gate stack 40, respectively. As the first LDD region 21 expands horizontally, the one side surface 21S' of the first LDD region 21 may be aligned with the one side surface 40S1 of the gate stack 40. As the second LDD region 23 expands horizontally, the one side surface 23S' of the second LDD region 23 may be aligned with the other side surface 40S2 of the gate stack 40. The distance W2, by which the first LDD region 21 expands horizontally, may be equal to the distance W1 described with reference to FIG. 12.

As described above, the semiconductor device manufacturing method according to the exemplary embodiment may include forming the gate stack 40 after formation of the first LDD region 21. The gate stack 40 may be formed taking into consideration subsequent horizontal expansion of the first LDD region 21 caused by formation of the drain region DR and, as such, it may be possible to align the one side surface 21S of the first LDD region 21 with the one side surface 40S1 of the gate stack 40. Accordingly, it may be possible to reduce the size of the gate stack 40 (that is, the gate structure GS) to a minimum size while forming the first LDD region 21 to achieve a certain breakdown voltage level. That is, the gate stack 40 may be formed to have a minimum size for formation of an asymmetric high-voltage transistor.

FIGS. 18 to 21 are sectional views explaining a method for manufacturing a semiconductor device in accordance with an exemplary embodiment.

Figure 18:
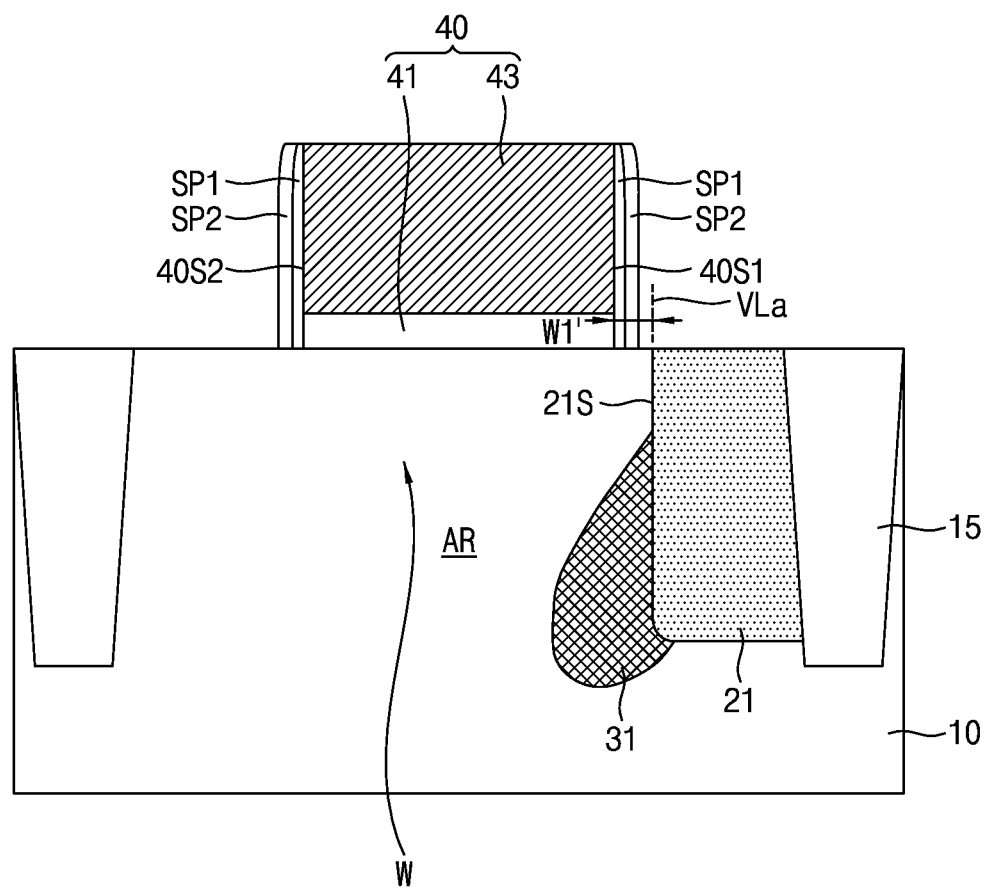
FIGS. 18 to 21 are sectional views explaining a method for manufacturing a semiconductor device in accordance with an exemplary embodiment.

Referring to FIG. 18, the outer side wall of the intermediate gate spacer SP2 formed on the one side wall 40S1 of the gate stack 40 may be formed to be offset from the one side surface 21S of the first LDD region 21. The intermediate gate spacer SP2 may vertically overlap with the well region W, and may not vertically overlap with the first LDD region 21. The one side wall 40S1 of the gate stack 40 and a vertical line VLa aligned with the one side surface 21S of the first LDD region 21 may be spaced apart from each other by a horizontal distance W1'. In some exemplary embodiments, the horizontal distance W1' may be predetermined.

Figure 19:
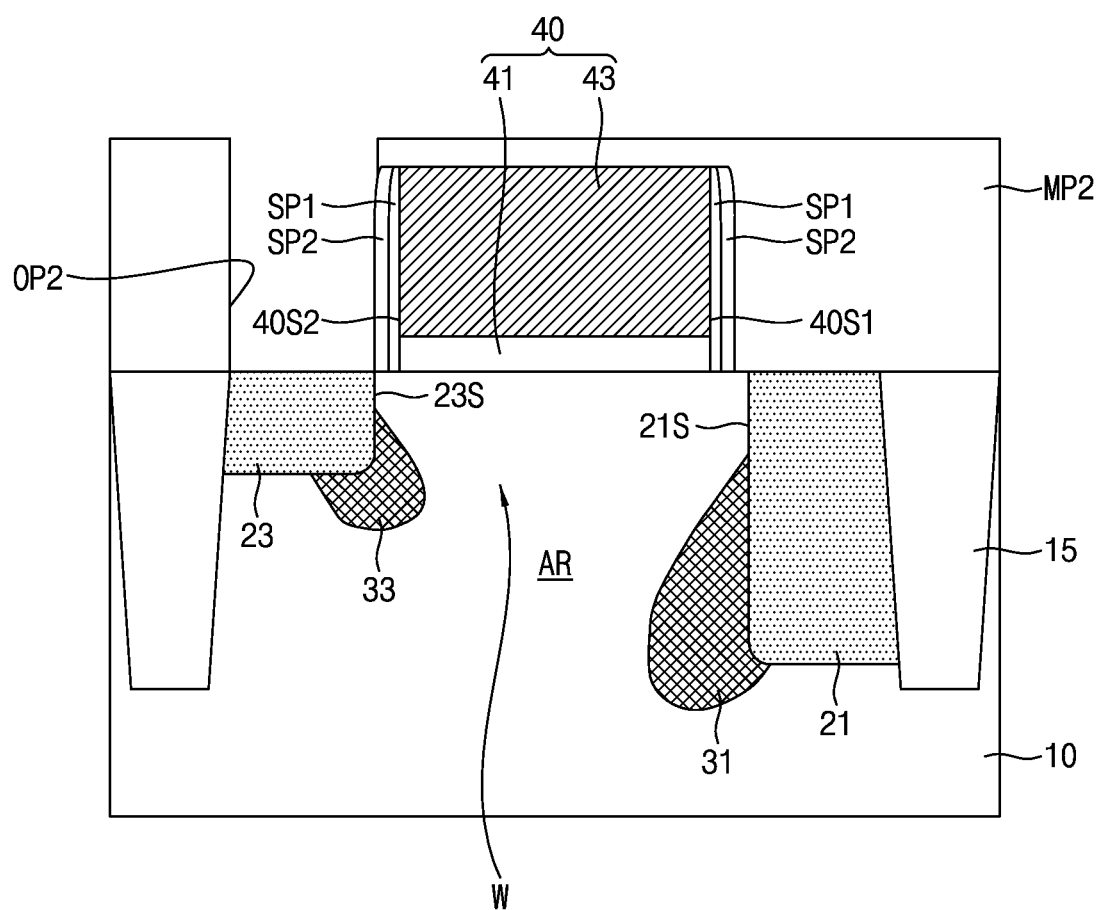

Referring to FIG. 19, the method may include forming the second LDD region 23 and the second halo region 33 after forming a second mask pattern MP2. The second LDD region 23 may be formed to be aligned with the outer side wall of the intermediate gate spacer SP2 adjacent thereto.

Figure 20:
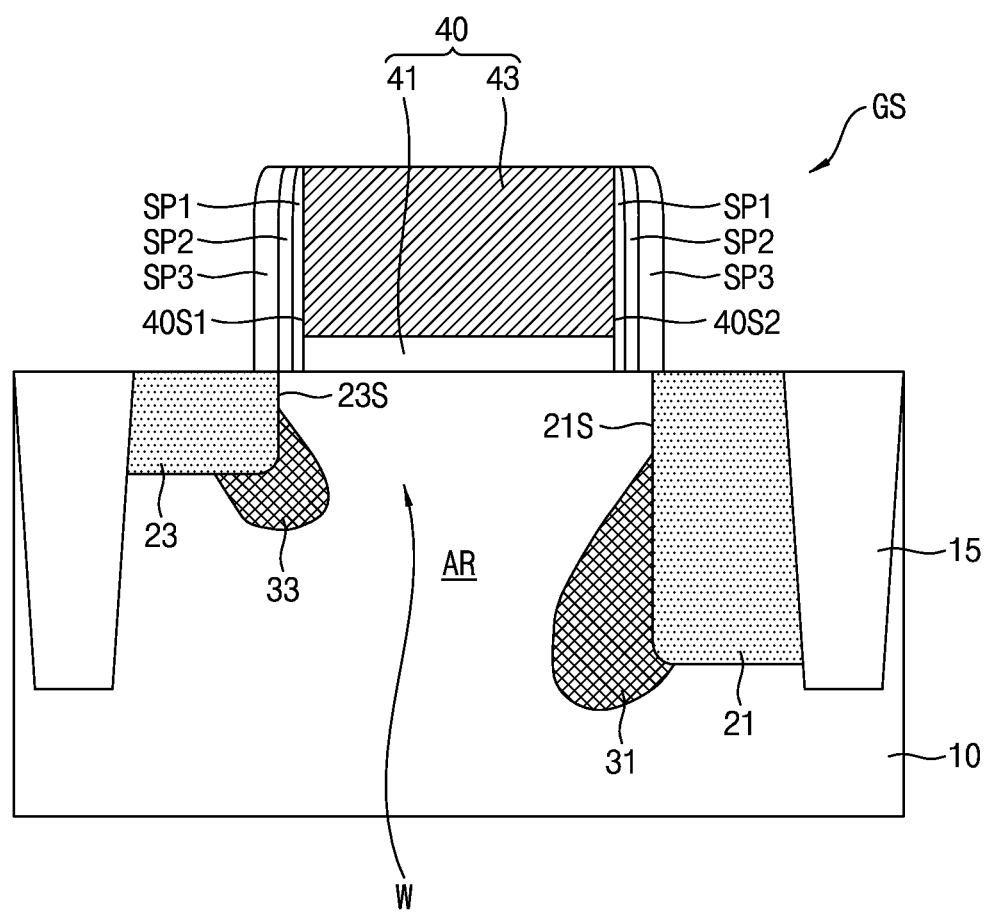

Referring to FIG. 20, the method may include forming the outer gate spacers PS3. The outer gate spacers SP3 may vertically overlap with the first and second LDD regions 21 and 23, respectively. A portion of the outer gate spacer SP3 disposed on the one side wall 40S1 of the gate stack 40 may vertically overlap with a portion of the first LDD region 21. The outer gate spacer SP3 disposed on the other side wall 40S2 of the gate stack 40 may be completely vertically overlap with a portion of the second LDD region 23.

Figure 21:
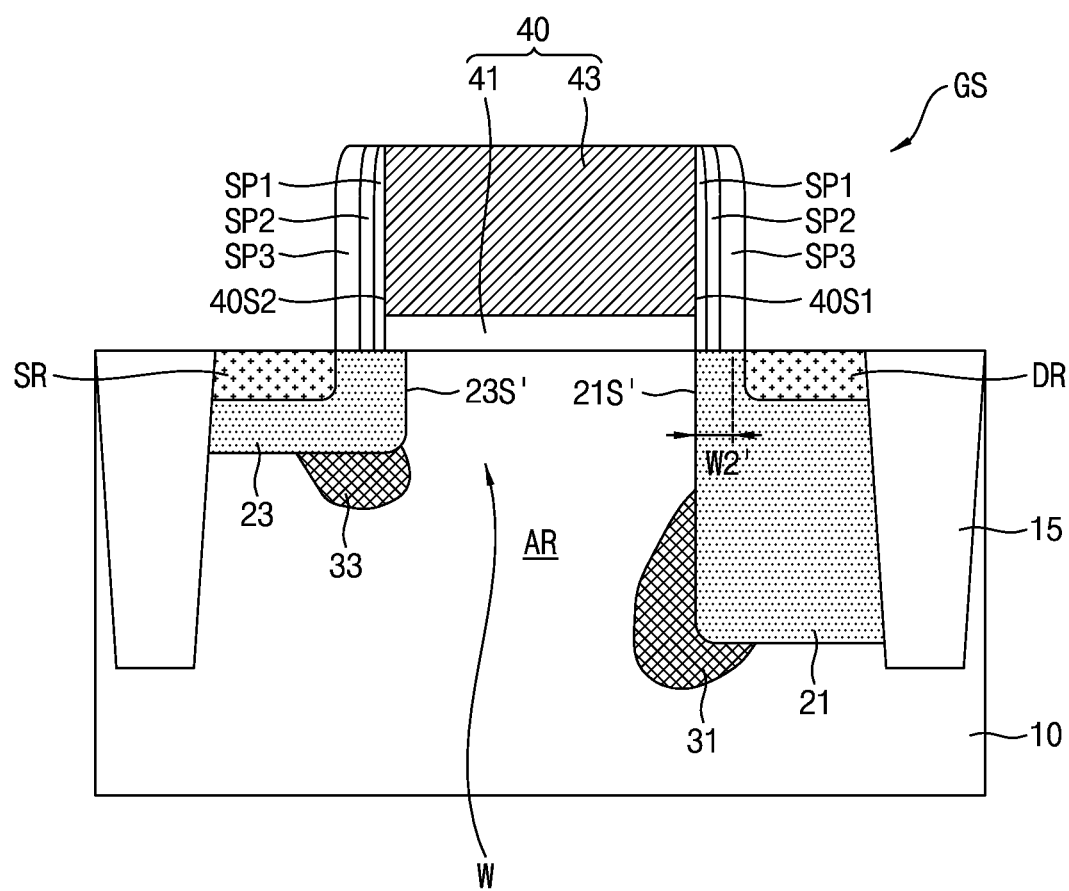

Referring to FIG. 21, the method may include forming the source region SR and the drain region DR. The first and second LDD regions 21 and 23 may be horizontally expanded by an ion implantation process for formation of the source region SR and the drain region DR. Side surfaces 21S' and 23S' of the first and second LDD regions 21 and 23 may shift toward the active region AR. As the first LDD region 21 expands, the one side surface 21S' of the first LDD region 21 may be aligned with the one side wall 40S1 of the gate stack 40. A distance W2', by which the first LDD region 21 expands horizontally, may be equal to the horizontal distance W1' described with reference to FIG. 18. As the second LDD region 23 expands, a portion of the second LDD region 23 may vertically overlap with a portion of the gate stack 40. For example, the distance, by which the second LDD region 23 expands horizontally, may substantially equal to the distance W2', by which the first LDD region 21 expands horizontally, without being limited thereto.

In accordance with the exemplary embodiments of the disclosure, it may be possible to reduce the size of an asymmetric high-voltage semiconductor device while maintaining a breakdown voltage of the asymmetric high-voltage semiconductor device to a certain level.

While various exemplary embodiments have been described with reference to the accompanying drawings, it should be understood by those skilled in the art that various modifications may be made without departing from the scope of the disclosure. Therefore, the above-described exemplary embodiments should be considered in a descriptive sense only and not for purposes of limitation.

What is claimed is:

1. A semiconductor device comprising:
   a substrate comprising an active region;
   a gate structure disposed on the active region;
   a source region and a drain region formed in the active region at opposite sides of the gate structure, respectively, the source region being spaced apart from the drain region;
   a first lightly doped drain (LDD) region surrounding one side surface and a bottom surface of the drain region, the first LDD region comprising first-conductivity-type impurities and having a first junction depth; and
   a second LDD region surrounding one side surface and a bottom surface of the source region, the second LDD region comprising the first-conductivity-type impurities and having a second junction depth less than the first junction depth,
   wherein the gate structure comprises:
   a gate dielectric layer,
   a gate electrode on the gate dielectric layer, and
   gate spacers respectively disposed on opposite side walls of the gate dielectric layer and the gate electrode, and
   wherein one side wall of the opposite side walls of the gate dielectric layer and the gate electrode is aligned with one side surface of the first LDD region.

2. The semiconductor device according to claim 1, wherein the first LDD region vertically overlaps with the gate spacers, and does not vertically overlap with the gate dielectric layer and the gate electrode.

3. The semiconductor device according to claim 1, further comprising:

a first halo region formed in the active region adjacent to a lower portion of the first LDD region, the first halo region comprising second-conductivity-type impurities; and
a second halo region formed in the active region adjacent to a lower portion of the second LDD region, the second halo region comprising the second-conductivity-type impurities.

4. The semiconductor device according to claim 3, wherein the first halo region is disposed closer to a bottom surface of the substrate than the second halo region.

5. The semiconductor device according to claim 3, wherein a junction depth of the first halo region is about 1,800 Å to about 2,000 Å, and a junction depth of the second halo region is about 300 Å to about 350 Å.

6. The semiconductor device according to claim 3, wherein each of the first halo region and the second halo region vertically overlaps with a portion of the gate dielectric layer and a portion of the gate electrode.

7. The semiconductor device according to claim 1, wherein the first junction depth is about 900 Å to about 1,100 Å, and the second junction depth is about 40 Å to about 60 Å.

8. The semiconductor device according to claim 1, wherein a side wall of the source region is aligned with a first outer side wall of the gate spacers, and a side wall of the drain region is aligned with a second outer side wall of the gate spacers.

9. The semiconductor device according to claim 1, wherein the second LDD region vertically overlaps with a portion of each of the gate dielectric layer and the gate electrode.

10. The semiconductor device according to claim 1, wherein one side surface of the second LDD region is offset from the opposite side walls of the gate dielectric layer and the gate electrode.

11. The semiconductor device according to claim 1, wherein one side surface of the second LDD region is aligned with another side wall of the opposite side walls of the gate dielectric layer and the gate electrode.

12. The semiconductor device according to claim 1, wherein each of the gate spacers comprises:
    an inner gate spacer directly disposed on a corresponding one of the opposite side walls of the gate dielectric layer and the gate electrode;
    an intermediate gate spacer on the inner gate spacer; and
    an outer gate spacer on the intermediate gate spacer.

13. The semiconductor device according to claim 12, wherein:
    the inner gate spacer and the outer gate spacer comprise a silicon nitride; and
    the intermediate gate spacer comprises a silicon oxide.

14. A semiconductor device comprising:
    a substrate comprising an active region;
    a gate structure disposed on the active region;
    a source region and a drain region formed in the active region at opposite sides of the gate structure, respectively, the source region being spaced apart from the drain region;
    a first lightly doped drain (LDD) region formed in the active region adjacent to the drain region, the first LDD region comprising first-conductivity-type impurities and having a first junction depth;
    a first halo region formed in the active region adjacent to the first LDD region, the first halo region comprising second-conductivity-type impurities;

a second LDD region formed in the active region adjacent to the source region, the second LDD region comprising the first-conductivity-type impurities and having a second junction depth less than the first junction depth; and a second halo region formed in the active region adjacent to the second LDD region, the second halo region comprising the second-conductivity-type impurities, wherein the gate structure comprises:

a gate stack, and gate spacers respectively disposed on opposite side walls of the gate stack, wherein one side surface of the second LDD region is offset from the opposite side walls of the gate stack, and wherein one side surface of the first LDD region is aligned with one side wall of the opposite side walls of the gate stack.

15. The semiconductor device according to claim 14, wherein the first LDD region does not vertically overlap with the gate stack.

16. The semiconductor device according to claim 14, wherein:

a junction depth of the first halo region is greater than the first junction depth; and a junction depth of the second halo region is greater than the second junction depth.

17. The semiconductor device according to claim 14, wherein the second LDD region vertically overlaps with a portion of the gate stack.

18. The semiconductor device according to claim 14, wherein the second LDD region does not vertically overlap with the gate stack.

19. The semiconductor device according to claim 14, wherein the gate stack comprises a gate dielectric layer on the active region, and a gate electrode on the gate dielectric layer.

20. A semiconductor device comprising:

a substrate comprising an active region;

a gate structure disposed on the active region;

a source region and a drain region formed in the active region at opposite sides of the gate structure, respectively, the source region being spaced apart from the drain region;

a first lightly doped drain (LDD) region formed in the active region adjacent to the drain region, the first LDD region comprising first-conductivity-type impurities and having a first junction depth;

a first halo region formed in the active region adjacent to the first LDD region, the first halo region comprising second-conductivity-type impurities;

a second LDD region formed in the active region adjacent to the source region, the second LDD region comprising the first-conductivity-type impurities and having a second junction depth less than the first junction depth; and a second halo region formed in the active region adjacent to the second LDD region, the second halo region comprising the second-conductivity-type impurities, wherein the gate structure comprises:

a gate stack, and gate spacers respectively disposed on opposite side walls of the gate stack, wherein one side surface of the second LDD region is offset from the opposite side walls of the gate stack, wherein one side surface of the first LDD region is aligned with one side wall of the opposite side walls of the gate stack, and wherein at least a portion of the first halo region vertically overlaps with the gate stack and at least a portion of the second halo region vertically overlaps with the gate stack.

* * * * *